(12) United States Patent
Kimizuka et al.

(10) Patent No.: US 7,754,570 B2
(45) Date of Patent: Jul. 13, 2010

(54) SEMICONDUCTOR DEVICE

(75) Inventors: Naohiko Kimizuka, Kanagawa (JP); Kiyotaka Imai, Kanagawa (JP); Yuri Masuoka, Kanagawa (JP); Toshiyuki Iwamoto, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/210,873

(22) Filed: Aug. 25, 2005

(65) Prior Publication Data

US 2006/0043497 A1  Mar. 2, 2006

(30) Foreign Application Priority Data

Aug. 25, 2004  (JP)  .............................. 2004-245289
Aug. 18, 2005  (JP)  .............................. 2005-237209

(51) Int. Cl.
  *H01L 21/336* (2006.01)
(52) U.S. Cl. ........................ 438/287; 438/283; 438/587; 438/591; 257/E21.625; 257/E21.639
(58) Field of Classification Search ................ 257/288, 257/405–407, 392, 402, 408, 365, 368, 388, 257/E21.633, E21.365, E21.625, E21.639; 438/199, 283, 287, 587, 588, 591, FOR. 405, 438/FOR. 177
See application file for complete search history.

(56) References Cited

U.S. PATENT DOCUMENTS 5,079,613 A * 1/1992 Sawada et al. ............... 257/409
5,668,024 A * 9/1997 Tsai et al. .................... 438/199
5,952,701 A * 9/1999 Bulucea et al. .............. 257/407
6,373,111 B1 * 4/2002 Zheng et al. ................. 257/407

(Continued)

FOREIGN PATENT DOCUMENTS

JP        06-222387          8/1994

(Continued)

OTHER PUBLICATIONS

"Fermi Level Pinning at the PolySI/Metal Oxide Interface" C. Hobbs, L. Fonseca, V. Dhandapani, S. Samavedam, B. Taylor, J. Grant, L. Dip, D. Triyoso, R. Hedge, D. Gilmer, R. Garcia, D. Roan, L. Lovejoy, R. Rai, L. Herbert, H. Tseng, B. White and P. Tobin, APRADL, Digital DNA Laboratories, Motorola, Austin TX, 2003 Symposium on VLSI Technology Digest of technical Papers.

*Primary Examiner*—Matthew Smith
*Assistant Examiner*—Quovaunda Jefferson
(74) *Attorney, Agent, or Firm*—Young & Thompson

(57) ABSTRACT

Threshold voltage of a field effect transistor is successfully adjusted with a smaller dose of an impurity, as compared with a conventional adjustment of the threshold voltage only by doping an impurity into the channel region. A semiconductor device 100 has a silicon substrate 101 and a P-type MOSFET 103 comprising a SiON film 113 formed on the silicon substrate 101, and a polycrystalline silicon film 106. Any one of, or two or more of metals selected from the group consisting of Hf, Zr, Al, La, Pr, Y, Ti, Ta and W are allowed to reside at the interface 115 between the polycrystalline silicon film 106 and the SiON film 113, and concentration of the metal(s) at the interface 115 is adjusted to $5 \times 10^{13}$ atoms/cm$^2$ or more and less than $1.4 \times 10^{15}$ atoms/cm$^2$.

18 Claims, 10 Drawing Sheets

U.S. PATENT DOCUMENTS

| | | | |
|---|---|---|---|
| 6,563,182 B2* | 5/2003 | Horikawa | 257/405 |
| 6,858,524 B2* | 2/2005 | Haukka et al. | 438/585 |
| 7,141,466 B2* | 11/2006 | Sato et al. | 438/197 |
| 2004/0014306 A1* | 1/2004 | Komatsu | 438/585 |
| 2004/0092073 A1* | 5/2004 | Cabral et al. | 438/287 |
| 2005/0205900 A1* | 9/2005 | Forbes et al. | 257/288 |

FOREIGN PATENT DOCUMENTS

JP    2002-280461    9/2002

* cited by examiner

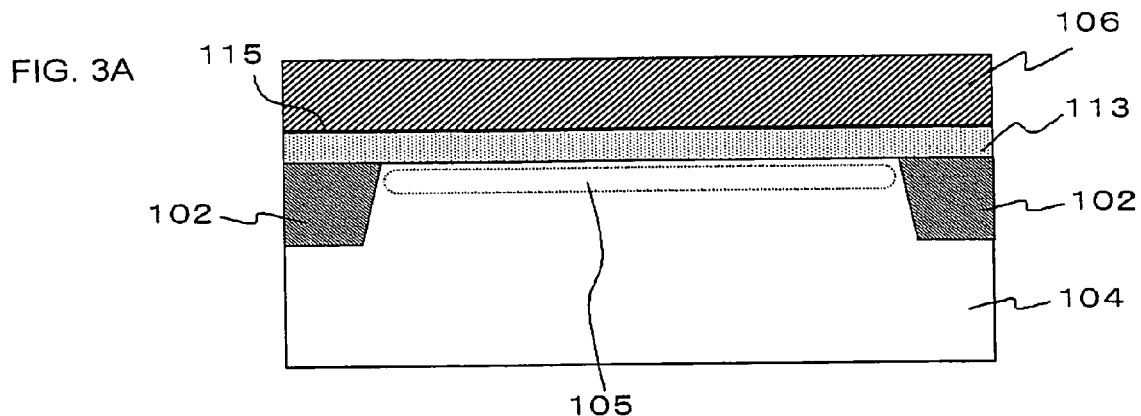
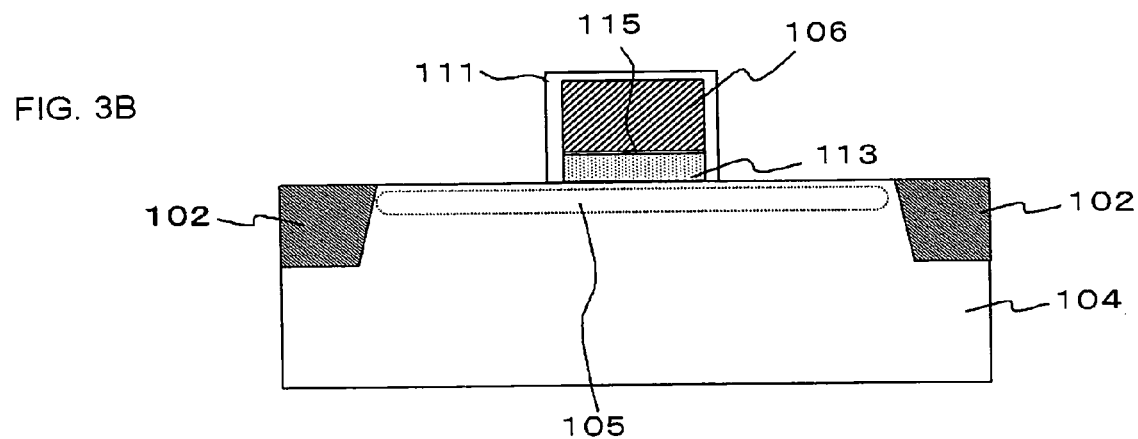
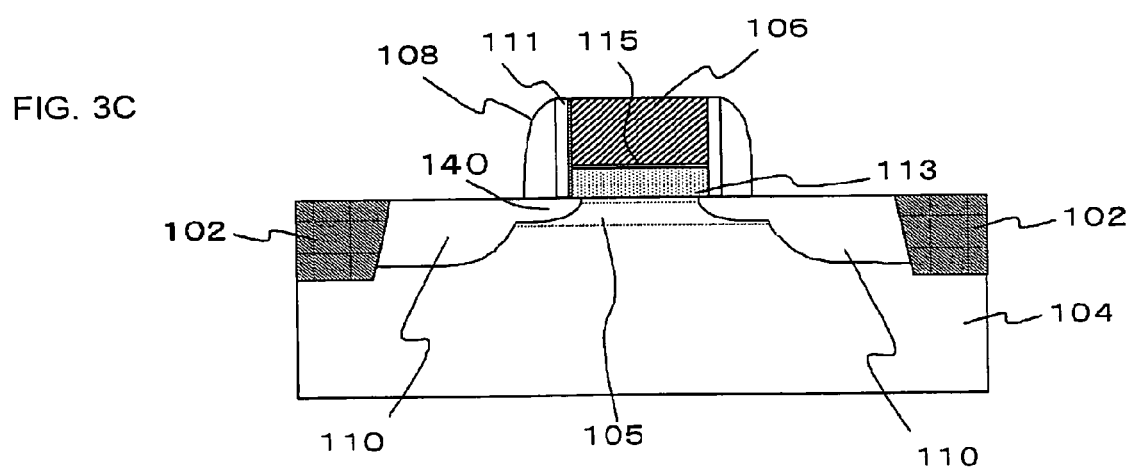

SEMICONDUCTOR DEVICE

This application is based on Japanese patent applications No. 2004-245289 and No. 2005-237209 the content of which is incorporated hereinto by reference.

DISCLOSURE OF THE INVENTION

1. Field of the Invention

The present invention relates to a semiconductor device having a field effect transistor.

2. Related Art

In semiconductor devices having field effect transistors, threshold voltage of the transistors has conventionally been controlled by doping an impurity into the channel region and by appropriately adjusting the dose amount (Japanese Laid-Open Patent Publication No. H6-222387). The threshold voltage control only through adjustment of the amount of the channel impurity, however, raises nonconformities such that an increase in the dose of the impurity to be doped into the channel region may lower ON-state current due to scattering by the impurity, may increase in GIDL (Gate-Induced Drain Leakage) current, and may increase substrate current upon application of substrate voltage. For this reason, low-power-consumption devices having a large amount of impurity doped into the channel region have occasionally resulted in decrease in the ON-state current, and increase in the GIDL current. Also semiconductor devices based on an intentional use of substrate voltage effect have occasionally increased substrate current upon application of substrate voltage.

Japanese Laid-Open Patent Publication No. H6-222387 proposed a technique for use in a semiconductor device having a CMOS (complementary metal oxide semiconductor), by which thickness of a gate oxide film of an N-channel TFT is differed from that of a gate oxide film of a P-channel TFT. It is described that making difference between the thickness of the gate oxide films makes it possible to independently control the threshold voltage of the N-channel TFT and the P-channel TFT.

In recent years, there has been another trend of using a high dielectric constant film, called "high-k film", as a material for composing the semiconductor device. Representative high-k materials include oxides typically containing Zr, Hf or the like. Use of this sort of materials for a gate insulating film of a MOSFET (metal oxide semiconductor field effect transistor) can successfully reduce the equivalent silicon oxide thickness in an electrical sense, even if the physical thickness thereof is increased to a certain extent, realizing a gate insulating film stable both in a physical sense and in a structural sense. This makes it possible to increase a MOS capacity for improved MOSFET characteristics, and to reduce gate leakage current as compared with the conventional case where the silicon oxide film was used.

Japanese Laid-Open Patent Publication No. 2002-280461 discloses a CMOS device comprising an N-type MOSFET and a P-type MOSFET using such high-k material. The N-type MOSFET and the P-type MOSFET in this case comprises a gate insulating film composed of a low dielectric constant film, such as a silicon oxide film, and a high dielectric constant film, and a gate electrode composed of polycrystalline silicon or the like. A gate electrode is provided in contact with the high dielectric constant film of the gate insulating film.

The technique described in Japanese Laid-Open Patent Publication No. H6-222387 in the above, however, needs an additional step of making difference in the thickness of the gate insulating films, and this undesirably makes the entire process of fabrication more complicated.

It was also revealed from investigations by the present inventors, that the CMOS device using the high-k material described in the foregoing Japanese Laid-Open Patent Publication No. 2002-280461 resulted in increase in the threshold voltage beyond a desired value, when the gate insulating film was configured using a high dielectric constant film and the gate electrode was configured using polycrystalline silicon.

SUMMARY OF THE INVENTION

The present inventors investigated into the CMOS device using the high-k material described in the foregoing Japanese Laid-Open Patent Publication No. 2002-280461, and found out that the increase in the threshold voltage observed when the high-k material was used was ascribable to specific elements contained in the high dielectric constant film. The present inventors also found out that the threshold voltage is adjustable if a certain species of element is located in contact with the gate electrode within a concentration range different from the concentration range of the specific elements originally reside in the high-k film.

According to the present invention, there is provided a semiconductor device having a plurality of field effect transistors each of which comprises:

a semiconductor substrate;

a Si-containing gate electrode provided on the semiconductor substrate; and a gate insulating film provided between the semiconductor substrate and the Si-containing gate electrode, so as to contact with the Si-containing gate electrode;

wherein each of said plurality of field effect transistors has any one of, or two or more of metals selected from the group consisting of Hf, Zr, Al, La, Pr, Y, Ti, Ta and W contained at the interface between the Si-containing gate electrode and the gate insulating film;

concentration of the metal(s) at the interface falls in a range from $5 \times 10^{13}$ atoms/cm$^2$ or more and less than $1.4 \times 10^{15}$ atoms/cm$^2$; and at least one of the field effect transistors has an impurity concentration in the channel region of the one of the field effect transistor differed from impurity concentration in the channel regions of the other field effect transistor.

The semiconductor device of the present invention is configured so that the above-described metal having the above-described concentration is located at the interface between the Si-containing gate electrode and the gate insulating film of the field effect transistor. The threshold voltage of the field effect transistor varies with concentration of the metal within the above-described concentration range. The above-described configuration therefore allows adjustment of the threshold voltage of the field effect transistor by using these metals at the concentration within a variable range for the threshold voltage. The present invention thus makes it possible to exactly adjust the threshold voltage of the field effect transistor.

It is to be noted that, as described later, the metal concentration within a certain range exceeding the above-described range, for example within a concentration range of the above-described metals in the conventional high dielectric constant film, will make the threshold voltage of the field effect transistor higher than a desired value, and will provide only a small variation with the metal concentration. For this reason, the conventional configuration, having the conventional high dielectric constant film will never be successful in obtaining the effect of the present invention.

In the conventional configuration, the threshold voltage of the field effect transistor has been adjusted solely by the amount of ion dose into the channel region, as descried in the foregoing Japanese Laid-Open Patent Publication No. H6-222387. In contrast, the present invention is capable of adjusting the threshold voltage by the metal concentration, and of reducing the amount of ion dose even in combination with the ion implantation into the channel region. This makes it possible to increase ON-state current of the field effect transistor. It is also made possible for the field effect transistor to reduce the GIDL current and the substrate current upon application of the substrate voltage.

Also, the semiconductor device according to the present invention is configured so that the above-described metal having the above-described concentration is located at the interface between the Si-containing gate electrode and the gate insulating film of the field effect transistor, thus, the threshold voltage can be adjusted by ion implantation and the amount of ion dosage can be decreased, therefore the configuration in which at least one of the field effect transistors has an impurity concentration in the channel region of the one of the field effect transistor differed from impurity concentration in the channel regions of the other field effect transistor can stably realized with high yield.

According to the present invention, there is also provided a semiconductor device having a plurality of field effect transistors each of which comprises:

a semiconductor substrate;

a Si-containing gate electrode provided on the semiconductor substrate; and a gate insulating film provided between the semiconductor substrate and the Si-containing gate electrode, so as to contact with the Si-containing gate electrode;

wherein each of said plurality of field effect transistors has any one of, or two or more of metals selected from the group consisting of Hf, Zr, Al, La, Pr, Y, Ti, Ta and W contained in the gate insulating film;

concentration of the metal(s) in the gate insulating film falls in a range from $5 \times 10^{13}$ atoms/cm$^3$ or more and less than $1.4 \times 10^{15}$ atoms/cm$^3$; and at least one of the field effect transistors has an impurity concentration in the channel region of the one of the field effect transistor differed from impurity concentration in the channel regions of the other field effect transistor.

The semiconductor device of the present invention is configured so that the above-described metal with the above-described concentration is located in the gate insulating film in contact with the Si-containing gate electrode of the field effect transistor. The threshold voltage of the field effect transistor varies with concentration of the metal within the above-described concentration range. The above-described configuration therefore allows adjustment of the threshold voltage of the field effect transistor by allowing these metals to be contained in the gate insulating film, at the concentration within a variable range for the threshold voltage. The present invention thus makes it possible to reduce the dose of the channel impurity.

In the semiconductor device of the present invention, the gate insulating film may be configured as containing Si together with the above-described metal. This makes it possible to make the gate insulating film, in contact with the Si-containing gate electrode, have the metal diluted by Si. It is therefore made possible to exactly reduce the dose amount of the channel impurity, and to exactly adjust the threshold voltage of the field effect transistor.

In the semiconductor device of the present invention, the plurality of field effect transistors may be configured as comprising an N-channel field effect transistor and a P-channel field effect transistor, and as allowing the interface in the N-channel field effect transistor and the interface in the P-channel field effect transistor to contain the metal of the same species in common. In the present invention, the interface in the N-channel field effect transistor and the interface in the P-channel field effect transistor may also contain a plurality of these metals in common.

In the semiconductor device of the present invention, the plurality of field effect transistors may be configured as comprising a plurality of field effect transistors of one conductivity type, and as allowing the interfaces in the plurality of field effect transistors of one conductivity type to contain the metal of the same species and concentration in common, and as allowing an impurity concentration in the channel region of at least one of the plurality of field effect transistors of one conductivity type to be differed from an impurity concentration in the channel region of another one of the plurality of field effect transistors of one conductivity type.

In the semiconductor device of the present invention, the plurality of field effect transistors may be configured as comprising a plurality of field effect transistors of one conductivity type, and as allowing the gate insulating films in the plurality of field effect transistors of one conductivity type to contain the metal of the same species and concentration in common, and as allowing an impurity concentration in the channel region of at least one of the plurality of field effect transistors of one conductivity type to be differed from an impurity concentration in the channel region of another one of the plurality of field effect transistors of one conductivity type.

In the semiconductor device of the present invention, the plurality of field effect transistors may be configured as comprising an N-channel field effect transistor and a P-channel field effect transistor, and as allowing the gate insulating film in the N-channel field effect transistor and the gate insulating film in the P-channel field effect transistor to contain the metal of the same species in common. In the present invention, the gate insulating film in the N-channel field effect transistor and the gate insulating film in the P-channel field effect transistor may also contain a plurality of these metals in common.

This makes it possible to fabricate the semiconductor device excellent in the controllability of the threshold voltage of the N-channel field effect transistor and the P-channel field effect transistor, using a simple process.

In the semiconductor device of the present invention, the plurality of field effect transistors may be configured as comprising an N-channel field effect transistor and a P-channel field effect transistor, and as allowing the interface in the N-channel field effect transistor and the interface in the P-channel field effect transistor to contain the metals of different species.

In the semiconductor device of the present invention, the plurality of field effect transistors may be configured as comprising an N-channel field effect transistor and a P-channel field effect transistor, and as allowing the gate insulating film in the N-channel field effect transistor and the gate insulating film in the P-channel field effect transistor to contain the metals of different species.

This makes it possible to improve the individual characteristics of the N-channel field effect transistor and the P-channel field effect transistor. It is also made possible to further improve the controllability of the individual threshold voltage values.

In the semiconductor device of the present invention, the plurality of field effect transistors may be configured as comprising an N-channel field effect transistor containing Al as the metal. In the semiconductor device of the present invention, the plurality of field effect transistors may also comprise a P-channel field effect transistor containing Hf or Zr as the metal. This makes it possible to further exactly adjust the threshold voltage of the field effect transistor.

According to the present invention, there is provided a semiconductor device having a field effect transistor which comprises:

a semiconductor substrate;

a Si-containing gate electrode provided on the semiconductor substrate; and a gate insulating film provided between the semiconductor substrate and the Si-containing gate electrode, so as to contact with the Si-containing gate electrode;

wherein the field effect transistor has any one of, or two or more of metals selected from the group consisting of Hf, Zr, Al, La, Pr, Y, Ti, Ta and W contained at the interface between the Si-containing gate electrode and the gate insulating film; and concentration of the metal(s) at the interface falls in a range from $5 \times 10^{13}$ atoms/cm$^2$ or more and less than $1.4 \times 10^{15}$ atoms/cm$^2$.

The semiconductor device of the present invention is configured so that the above-described metal with the above-described concentration is located in the gate insulating film in contact with the Si-containing gate electrode of the field effect transistor. The threshold voltage of the field effect transistor varies with concentration of the metal within the above-described concentration range. The above-described configuration therefore allows adjustment of the threshold voltage of the field effect transistor by allowing these metals to be contained in the gate insulating film, at the concentration within a variable range for the threshold voltage. The present invention thus makes it possible to reduce the dose of the channel impurity.

The semiconductor device of the present invention may be configured as comprising a plurality of field effect transistors of one conductivity type, and allowing the interfaces in the plurality of field effect transistors of one conductivity type to contain the metal of the same species and concentration in common, and allowing an impurity concentration in the channel region of at least one of the plurality of field effect transistors of one conductivity type to be differed from an impurity concentration in the channel region of another one of the plurality of field effect transistors of one conductivity type.

The semiconductor device of the present invention may be configured as including a plurality of the field effect transistors, and allowing the plurality of field effect transistors to comprise an N-channel field effect transistor and a P-channel field effect transistor, and allowing the interface in the N-channel field effect transistor and the interface in the P-channel field effect transistor to contain the metal of the same species in common.

In the semiconductor device of the present invention, the Si-containing gate electrode may contain Ni or Ge. This makes it possible to reduce thickness of a gate depletion layer or to lower resistivity of the Si-containing gate electrode.

In the semiconductor device of the present invention, the gate insulating film may comprise a SiON film. This makes it possible to prevent the impurity element contained in the Si-containing gate electrode from diffusing into the semiconductor substrate, and to consequently reduce variation in the threshold voltage of the field effect transistor.

It is to be noted that also any arbitrary combinations of these configurations, and any exchanges in the expression of the present invention among the methods, devices and so forth are effective as embodiments of the present invention.

For example, according to the present invention, there is provided a method of fabricating a field effect transistor comprising:

forming a channel region in a semiconductor substrate having a well of a predetermined conductivity type formed in the semiconductor substrate;

forming a gate insulating film on the channel region;

allowing any one of, or two or more of metals selected from the group consisting of Hf, Zr, Al, La, Pr, Y, Ti, Ta and W to reside on the gate insulating film so as to contact with the gate insulating film; and providing a Si-containing gate electrode film on the gate insulating film so as to contact with the metal, wherein threshold voltage of the field effect transistor is preliminarily set, and a relation of concentration of the metal at the interface between the gate insulating film and the Si-containing gate electrode film with an amount of increase in the threshold voltage of the field effect transistor is preliminarily acquired, a dose of an impurity in the channel region and the concentration of the metal, corresponded to the threshold voltage, are determined based on the relation, and the field effect transistor is fabricated based on the dose and the concentration thus determined.

According to the present invention, there is also provided a method of fabricating a field effect transistor comprising:

forming a channel region in a semiconductor substrate having a well of a predetermined conductivity type formed in the semiconductor substrate;

forming, on the channel region, a gate insulating film containing any one of, or two or more of metals selected from the group consisting of Hf, Zr, Al, La, Pr, Y, Ti, Ta and W; and forming a Si-containing gate electrode film so as to contact with the gate insulating film, wherein threshold voltage of the field effect transistor is preliminarily set, and a relation of concentration of the metal in the gate insulating film with an amount of increase in the threshold voltage of the field effect transistor is preliminarily acquired, a dose of an impurity in the channel region and the concentration of the metal, corresponded to the threshold voltage, are determined based on the relation, and the field effect transistor is fabricated based on the dose and the concentration thus determined.

According to the present invention, a dose of an impurity in the channel region and the concentration of the metal are determined so as to attain a set value of the threshold voltage, based on a preliminarily-acquired relation of concentration of the metal in the gate insulating film with an amount of increase in the threshold voltage of the field effect transistor, and the field effect transistor is fabricated based on the decision. This makes it possible to fabricate the field effect transistor having a desired threshold voltage by a simple process in a stable manner.

Further, the semiconductor device of the present invention may be configured as having a barrier film which covers side faces of the Si-containing gate electrode. This makes it possible to further exactly adjust the threshold voltage of the field effect transistor depending on the metal concentration. The present invention also allows a configuration in which the barrier film contains Si and N. This makes it possible to further exactly adjust the threshold voltage.

In the semiconductor device of the present invention, the gate insulating film may be configured as comprising a high dielectric constant film.

The present invention can realize a technique of adjusting the threshold voltage of the field effect transistor with a smaller dose of an impurity, as compared with the conventional adjustment of the threshold voltage only through doping an impurity into the channel region, by allowing any one of, or two or more of metals selected from the group consisting of Hf, Zr, Al, La, Pr, Y, Ti, Ta and W to reside at the interface between the gate electrode and the gate insulating film, and by adjusting concentration of the metal(s) at the interface within a range from $5 \times 10^{13}$ atoms/cm$^2$ or more and less than $1.4 \times 10^{15}$ atoms/cm$^2$.

BRIEF DESCRIPTION OF THE DRAWINGS

The above and other objects, advantages and features of the present invention will be more apparent from the following description taken in conjunction with the accompanying drawings, in which:

FIGS. 3A to 3C are sectional views showing process steps of fabricating the semiconductor device according to the embodiment of the present invention;

DETAILED DESCRIPTION OF THE INVENTION

Figure 1:
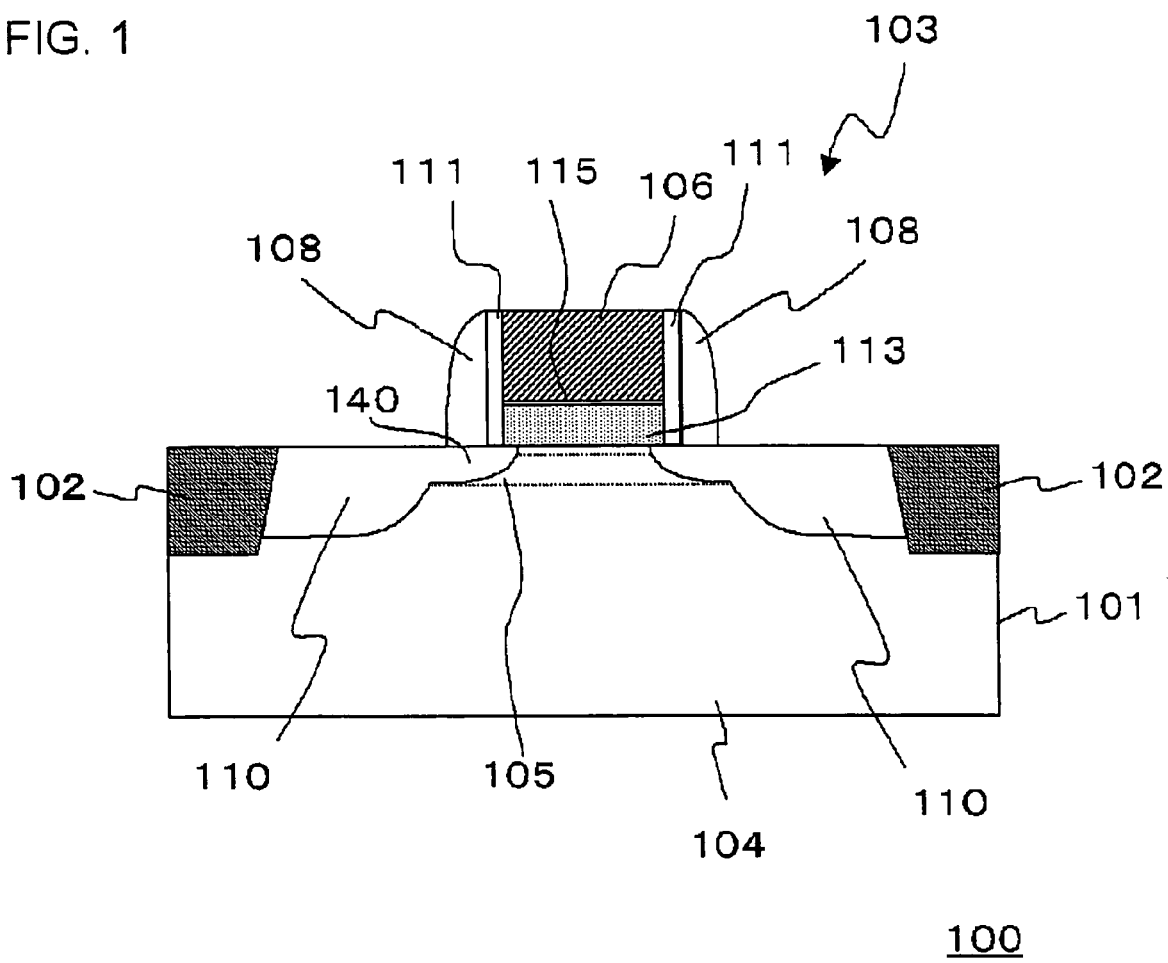
FIG. 1 is a sectional view showing a configuration of a semiconductor device according to one embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention referring to the attached drawings. Any similar constituents will be given with the same reference numerals in all drawings, allowing omission of explanations therefor on occasions.

First Embodiment

FIG. 1 is a sectional view schematically showing a configuration of a semiconductor device 100 according to the first embodiment. The semiconductor device 100 comprises a silicon substrate 101, and a P-type MOSFET 103 provided on the silicon substrate 101. There is also provided element isolation regions 102 in the outer circumferential portion of the P-type MOSFET 103.

In the P-type MOSFET 103, a pair of impurity diffused regions 110 are provided in an N-well 104, having an N-type conductivity, and is provided in the silicon substrate 101, and a channel region 105 is formed therebetween. The impurity diffused regions 110 are diffusion layers having a P-type impurity doped in the surficial portion of the N-well 104, one of which being intended for a source region, and the other for a drain region. Also, extension regions 140 are provided in an N-well 104.

On the channel region 105, there is provided an SiON film 113 as a gate insulating film, and on the SiON film 113, there is formed a polycrystalline silicon film 106 in contact with the SiON film 113. The polycrystalline silicon film 106 is a gate electrode film, and has a P-type impurity, such as B, doped therein. At the interface 115 between the SiON film 113 as the gate insulating film and the polycrystalline silicon film 106, Hf resides as an element causing increase in the threshold voltage due to Fermi level pinning. Hf adjusted within the lower concentration range described below can continuously increase the threshold voltage of the P-type MOSFET 103 depending on the abundance thereof at the interface 115 which corresponds to the surface of the polycrystalline silicon film 106.

At the interface 115, surface concentration of Hf is typically adjusted to $5 \times 10^{13}$ atoms/cm$^2$ or more. This makes it possible to exactly increase the threshold voltage of the P-type MOSFET 103. At the interface 115, the surface concentration of Hf is typically adjusted to less than $1.4 \times 10^{15}$ atoms/cm$^2$. This makes it possible to exactly adjust the threshold voltage of the P-type MOSFET 103 to a desirable level.

In the P-type MOSFET 103, there are provided sidewall barrier films 111 covering the side faces of the SiON film 113 and the polycrystalline silicon film 106, and sidewall insulating films 108 covering the sidewall barrier films 111.

Next paragraphs will describe a method of fabricating the semiconductor device 100 shown in FIG. 1. FIGS. 2A to 2C and FIGS. 3A to 3C are sectional views sequentially showing exemplary process steps of fabricating the semiconductor device 100 configured as shown in FIG. 1.

Figure 2A:
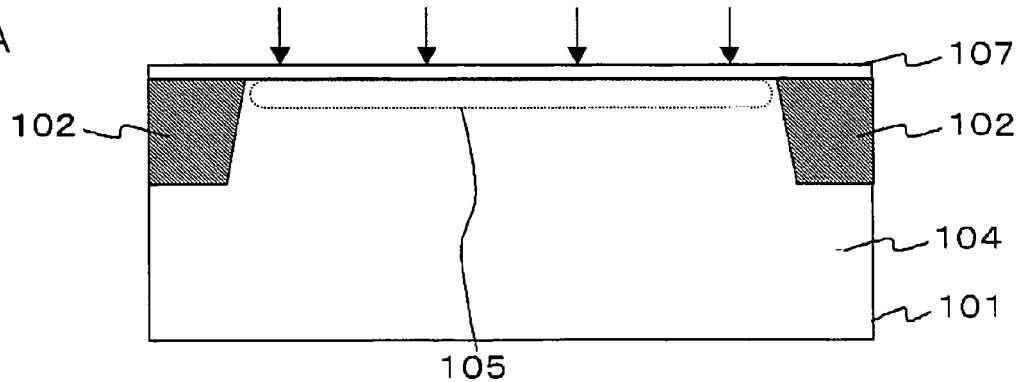
FIGS. 2A to 2C are sectional views showing process steps of fabricating the semiconductor device according to the embodiment of the present invention.

First, as shown in FIG. 2A, the element isolation regions 102 are formed on the silicon substrate 101 having (100) plane as the major surface, using a known technique based on STI (shallow trench isolation). The element isolation regions 102 may be formed by any other known methods such as the LOCOS process.

Next, a sacrificial oxide film 107 is formed on the surface of the silicon substrate 101. The sacrificial oxide film 107 can be obtained by thermally oxidizing the surface of the silicon substrate 101. Typical conditions for the thermal oxidation include a process temperature of 1,100 degree C. and a process time of 100 seconds or around. An N-well 104 is then formed by ion implantation of an N-type impurity. The N-well 104 is formed typically by doping phosphorus according to conditions of 150 KeV and within a range from $1 \times 10^{13}$ atoms/cm$^2$ to $5 \times 10^{13}$ atoms/cm$^2$, both ends inclusive.

Next, an ion species of a predetermined conductivity is ion-implanted into the N-well 104 through the sacrificial oxide film 107, to thereby form the channel region 105 in the surficial portion of the N-well 104 (FIG. 2A). The dose amount of the channel impurity into the channel region 105 is appropriately determined, together with the abundance of Hf at the interface 115, depending on a preliminarily-set threshold voltage of the P-type MOSFET 103 as described later. It is also allowable herein to form a punch-through stopper region by ion-implanting a N-type impurity under the channel region 105. Provision of such punch-through stopper region is successful in suppressing the short-channel effect.

Next, the sacrificial oxide film 107 is annealed and thereby the channel impurity is activated. Typical conditions for the annealing include a process temperature of 1,000 degree C. and a process time of 10 seconds or around. The sacrificial oxide film 107 formed on the N-well 104 is then removed. More specifically, the sacrificial oxide film 107 is etched off using a dilute hydrofluoric acid solution (for example, HF:H$_2$O=1:10), cleaned with a pure water, and dried typically by nitrogen blow.

Figure 2B:
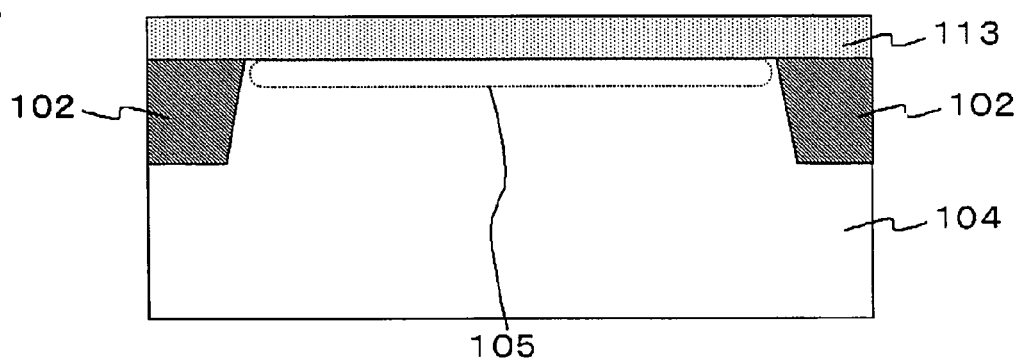

Next, the SiON film 113 (typically having a thickness of 0.5 nm to 3 nm, both ends inclusive) is formed on the surface of the silicon substrate 101 by the thermal oxidation process and the plasma nitriding process (FIG. 2B).

Figure 2C:
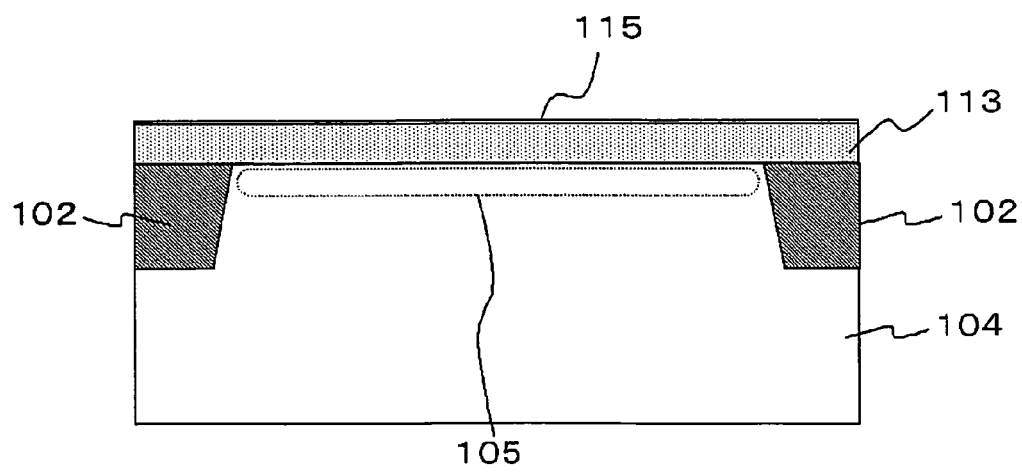

Then Hf is allowed to adhere on the top surface of the SiON film 113 (the interface 115 in the P-type MOSFET 103) (FIG. 2C). Adhesion of Hf is accomplished typically by the CVD process, ALD process (atomic layer deposition) process, or sputtering process, as described later. Annealing for improving film quality is optionally carried out if necessary.

The P-type MOSFET 103 shown in FIG. 2A and FIG. 2C is designed as follows. First, the threshold voltage is set depending on a layout and purpose of use of the P-type MOSFET 103 (S101). An abundance of Hf at the interface 115 and a dose amount of an impurity to be doped into the channel region are then set corresponding to the preliminarily-set threshold voltage (S102).

A relation between degree of increase in the threshold voltage of the P-type MOSFET 103 and the abundance of Hf at the interface 115 is preliminarily acquired. Also a relation between the threshold voltage of the P-type MOSFET 103 and a dose of an impurity into the channel region 105 is preliminarily acquired. These relations can typically be acquired through experiments. It is also allowable to store these relations in a database. For example, the Hf concentration at the interface 115 may be determined by making reference to a table correlating degree of increase in the threshold voltage of the P-type MOSFET 103 with abundance of Hf at the interface 115.

Conditions for allowing Hf adhesion are then determined according to the Hf abundance at the interface 115 set in the above-described step S102, based on the relation preliminarily obtained through experiments (S103). This process step makes it possible to design the P-type MOSFET 103 having a desired threshold voltage. The determination of conditions for allowing the Hf adhesion in step S103 will be described later.

Next, the polycrystalline silicon film 106 is formed on the SiON film 113 (FIG. 3A). It is also allowable, thereafter, to dope a P-type impurity such as B over the entire portion of the polycrystalline silicon film 106. Thickness of the polycrystalline silicon film is adjusted, for example, to 130 nm or around.

Next, the SiON film 113 and the polycrystalline silicon film 106 are selectively dry-etched to obtain a form of the gate electrode. A Si$_x$N$_y$ (each of x and y independently represents a positive integer) film, which later serves as the sidewall barrier films 111, is formed on the side faces and the top surface of the gate electrode composed of the SiON film 113 and the polycrystalline silicon film 106, to thereby cover the surface of the gate electrode (FIG. 3B). Thickness of the sidewall barrier film 111 is set typically to 1 nm to 10 nm, both ends inclusive. In order to form extension regions 140 which serve as electrical connection portions connecting the channel region 105 and the impurity diffused regions 110, the process herein adopts ion implantation of BF$_2$ under conditions of 2.5 keV and 5×10$^{14}$ atoms/cm$^2$.

Next, the sidewall insulating film 108 is formed over the entire area of formation of the N-well 104. A configuration accomplished herein is such that the sidewall barrier film 111 and the sidewall insulating film 108 are provided in this order on the side faces of the gate electrode which comprises the SiON film 113 and the polycrystalline silicon film 106. More specifically, the sidewall barrier film 111 and the sidewall insulating film 108 are anisotropically etched typically by using a fluorocarbon gas, so as to leave them only on the side faces of the SiON film 113 and the polycrystalline silicon film 106.

Next, a P-type impurity, such as B, is doped into the surficial portion of the N-well 104 as being masked by the gate electrode, the sidewall barrier films 111 and the sidewall insulating films 108. The source region and the drain region are thus formed. Boron is used herein as the P-type impurity. Conditions for the ion implantation typically include 2 keV, and a dose from 5×10$^{14}$ atoms/cm$^2$ to 5×10$^{15}$ atoms/cm$^2$, both ends inclusive. This is followed by annealing in a non-oxidative atmosphere to thereby activate the impurity. Conditions for the annealing typically include an annealing temperature within a range from 1,000 degree C. to 1,060 degree C. (FIG. 3C). The semiconductor device 100 (FIG. 1) having the P-type MOSFET 103 is completed by these processes.

In the above-described processes, it is difficult for the conventional method, using the ALD process or CVD process, to obtain the configuration in which Hf is adhered at the interface 115 so as to satisfy the above-described concentration range. For example, if a conventional method of fabricating a Hf-containing, high dielectric constant film is directly adopted to the Hf adhesion at the interface 115, a configuration satisfying the above-described concentration range cannot be obtained due to a large Hf concentration at the interface 115.

Now in the ALD process, a predetermined source gas is supplied multiple times in a pulsating manner. Thickness of the atomic layer deposited by the ALD process is determined as a result of the ALD cycle typically repeated 40 times or around. Investigations by the present inventors revealed that deposition of HfO$_2$ as a film, that is, to a thickness of a single or more atomic layers, on an insulating film such as a SiO$_2$ film or a SiON film, needed repetition of 23 times or more typically for the case where the high dielectric constant film is formed on the ordinary SiO$_2$ film. It was also found that a single adhesion layer did not configure a single atomic layer when the number of repetition is small, showing only a scarce adhesion of HfO$_2$ on the surface of the insulating film.

It is to be noted that the single atomic layer refers to a configuration in which HfO$_2$ in a layer form covers the entire surface of the insulating film. In contrast, the single adhesion layer refers to HfO$_2$ adhered by a single ALD cycle. Thickness of a single adhesion layer is a value obtained by dividing a thickness accomplished by the ALD cycles repeated by a number of times larger than that yielding a single atomic layer with the number of cycles, and is given as a thickness smaller than the thickness of a single atomic layer. This indicates that Hf exists scarcely on the surface of the insulating film.

In this embodiment, a predetermined source gas is used for the ALD process in the process step (above-descried step S103) shown in FIG. 2C, and the number of times the source gases are supplied in a pulsating manner is selected within a predetermined range. This makes it possible, for the first time, to allow Hf to exist at the interface 115 within the above-described concentration range. More specifically, $HfCl_4$ and $H_2O$ are used as the source gases, and the sequences listed below are carried out in this order:

(i) $N_2$ flow;
(ii) chemical adhesion of $HfCl_4$;
(iii) $N_2$ flow;
(iv) chemical adhesion of $H_2O$; and
(v) $N_2$ flow.

Because of a saturation amount of adhesion of Hf in a single gas supply in the process of the above-described (ii) chemical adhesion of $HfCl_4$, the sequences from (ii) to (iv) are repeated once or more and 22 times or less, and more preferably once or more and 15 times or less. In this embodiment, limitation of the number of times of repetition of the sequences from (ii) to (iv) to a distinctively small number of times as compared with that in the general procedures of forming a high dielectric-constant film on a $SiO_2$ film makes it possible to obtain a configuration in which the amount of adhesion of Hf at the interface 115 is extremely small as compared with the case of forming the high dielectric constant film. This makes it possible to adjust the amount of Hf within a range allowing adjustment of the threshold voltage. More specifically, the sequences from (ii) to (iv) repeated 10 times can suppress the Hf concentration in the $HfO_2$ produced at the interface 115 to as small as $4 \times 10^{14}$ atoms/cm$^2$ or around.

Next paragraphs will describe effects of the semiconductor device 100 shown in FIG. 1.

The semiconductor device 100 shown in FIG. 1 has the P-type MOSFET 103 configured so that a trace amount of Hf is allowed to exist at the interface 115 between the polycrystalline silicon film 106 and the SiON film 113. The threshold voltage of the P-type MOSFET 103 increases depending on the amount of metal, or Hf herein, which resides at the interface 115 between the polycrystalline silicon film 106 and the SiON film 113. The P-type MOSFET 103 is therefore configured so as to allow adjustment of the threshold voltage $V_{th}$, corresponding to the abundance of Hf at the interface 115.

This effect will distinctively be exhibited when the device is configured so that the sidewall barrier films 111 cover the side faces of the polycrystalline silicon film 106. Provision of the sidewall barrier films 111 can prevent oxygen from diffusing from the sidewall insulating films 108 to the polycrystalline silicon film 106, and this makes it possible to further exactly increase the threshold voltage at the interface 115. The configuration shown in the above used the $Si_xN_y$ (each of x and y independently represents a positive integer) film as the sidewall films 111, but it is also allowable to use a $SiO_2$ film which can be formed at 600 degree C. or below, in place of the $Si_xN_y$ (each of x and y independently represents a positive integer) film.

It is to be remembered now that, in the conventional field effect transistor described in the above referring to Japanese Laid-Open Patent Publication No. H6-222387, the threshold voltage was adjusted only by controlling the dose amount of the channel impurity. This, however, occasionally resulted in decrease in the ON-state current, increase in the GIDL current, and increase in the substrate current upon application of the substrate voltage, because of a large dosage of the channel impurity.

In contrast, it is made possible in the present embodiment to adjust the threshold voltage $V_{th}$ corresponding to the abundance of Hf at the interface 115. In a stacked structure of the polycrystalline silicon film 106 and the SiON film 113, the threshold voltage is therefore adjustable by controlling the Hf concentration at the interface 115, in addition to the dose of channel impurity doped into the channel region 105.

In the semiconductor device 100, it is therefore made possible to reduce the dose of channel impurity, as compared with the case where the threshold voltage of the P-type MOSFET 103 is adjusted only by controlling the dose of channel impurity doped into the channel region 105. In the semiconductor device 100, control of the abundance of Hf at the interface 115 therefore makes it possible to adjust the threshold voltage with a more wider degree of freedom, and to reduce the dose of channel impurity. This is successful in suppressing variation in the threshold voltage of the P-type MOSFET 103, and in stably adjusting it to a desired value. This configuration therefore allows a stable fabrication of transistors of desired quality with higher yield.

Also, in "Fermi Level Pinning at the PolySi/Metal Oxide Interface", C. Hobbs et al., 2003 Symposium on VLSI Technology Digest of Technical Papers, it is described that Vfb shifts when Hf adheres on $SiO_2$ film, while on the other hand, in this embodiment, not only the threshold voltage $V_{th}$ is shifted solely by adhering Hf, but is adjusted by ion implantation. In this embodiment, the ion dosage can be effectively decreased and the threshold voltage $V_{th}$ can exactly be adjusted to desired voltage, by adjusting the concentration of Hf at the interface 115 to $5 \times 10^{13}$ atoms/cm$^2$ or more and less than $1.4 \times 10^{15}$ atoms/cm$^2$.

In the semiconductor device 100 shown in FIG. 1, provision of the SiON film 113 as the gate insulating film can successfully prevent the impurity element contained in the polycrystalline silicon film 106 from diffusing into the silicon substrate 101. This makes it possible to exactly reduce variation in the threshold voltage of the P-type MOSFET 103. Other configurations of the gate will be described later in the fifth embodiment.

The semiconductor device 100 also makes it possible to increase Ion (ON-state current) of the P-type MOSFET 103, because the channel region 105 may have no channel impurity doped therein, or only a reduced amount of channel impurity doped therein. It is also made possible to suppress the GIDL current, and to suppress the substrate current upon application of the substrate voltage. This configuration of the P-type MOSFET 103 is therefore excellent in transistor characteristics.

In the P-type MOSFET 103, it is allowable to control the abundance of Hf at the interface 115 and the dose of channel impurity into the channel region 105, including the case where the dose of channel impurity is set to zero, corresponding to a preliminarily determined value of the threshold voltage.

The semiconductor device 100 shown in FIG. 1 can be fabricated without varying the thickness of the gate oxide film, unlike the method disclosed in the above-described Japanese Laid-Open Patent Publication No. H6-222387, and can therefore allow a wider applicability for known processes of film formation, and is therefore advantageous in terms of the process cost.

Increase in the threshold voltage given by a trace amount of Hf present at the interface 115 between the polycrystalline silicon film 106 and the SiON film 113 is supposed to follow the principle described in the next. Hf present at the interface 115 between the polycrystalline silicon film 106 and the SiON film 113 can bind with Si in the polycrystalline silicon film 106 at the interface 115, to thereby form a Hf—Si bond on the surface of the gate electrode film. This causes the above-described Fermi level pinning at the interface 115. With Hf, the Fermi level is formed at a position 0.3 eV away from the conduction band. The pinning causes depletion of the gate electrode film, and increases the threshold voltage of the P-type MOSFET 103.

Width of the depletion layer of the polycrystalline silicon film 106, which is the gate electrode film, herein, increases as the abundance of Hf at the interface 115 increases. The threshold voltage of the P-type MOSFET 103 and the abundance of Hf at the interface 115 are in a positive correlation, wherein the threshold voltage continuously increases as the Hf concentration at the interface 115 increases. This makes it possible to preliminarily understand a relation between the Hf abundance at the interface 115 and the degree of increase in the threshold voltage.

The Hf abundance at the interface 115 can preliminarily be acquired through experiments in correlation with the number of repetition of the above-described sequences (i) to (iv) in the ALD process. The P-type MOSFET 103 can therefore be obtained exactly corresponding to a desired threshold voltage, by setting the abundance of Hf corresponding to the threshold voltage required for the P-type MOSFET 103, by determining the number of repetition in the ALD process based on thus-set Hf abundance referring to the preliminarily-acquired relation between the number of repetition of the ALD process and the Hf abundance at the interface 115, and by repeating the determined number of ALD cycles.

Another topic on the conventional semiconductor device described in the above is that the high dielectric constant film containing Hf was used as the gate insulating film so as to be in contact with the polycrystalline silicon gate electrode. Investigations by the present inventors on the relation between the Hf abundance and the threshold voltage in this configuration revealed that no effect of controlling the threshold voltage was found. This was supposedly because the high dielectric constant film formed in a layered manner on the polycrystalline silicon gate electrode resulted in a high Hf concentration at the surface of the polycrystalline silicon gate electrode, for example as high as exceeding $1.4 \times 10^{15}$ atoms/cm$^2$. The above-described ALD sequences (i) to (iv) should have been repeated 23 cycles or more in order to form the high dielectric constant film. Adjustment of the threshold voltage was therefore unsuccessful supposedly because the configuration obtained under such film-forming conditions and having a high concentration of Hf had the threshold voltage higher than a desired value, and was saturated, so that the threshold voltage was less likely to vary even if the Hf concentration was varied.

The configuration of the P-type MOSFET 103 exemplified in the above was such as having a trace amount of Hf contained at the interface 115 between the polycrystalline silicon film 106 and the SiON film 113, whereas the trace metal present at the interface 115 is not limited to Hf, or rather it is also allowable to use any other metals provided that they can increase the threshold voltage when a Si-containing gate electrode, such as the polycrystalline silicon film 106, is used.

The metals which can reside at the interface 115 include:
metals known to cause the Fermi level pinning in polysilicon, such as Hf, Zr and Al;
metals used for increasing dielectric constant of insulating films, such as lanthanoid metals including La and Pr, and Y; and
metals having potential at the Fermi level at around the mid-gap, that is an intermediate level between the conduction band and the valence band of silicon, such as Ta, Ti and W.

Also with respect to the metals used for increasing the dielectric constant of insulating films, and the metals having potential at the Fermi level at around the mid-gap of silicon, it is possible to adjust the threshold voltage similarly to the case with the metals such as Hf, Zr and Al, if they are present at the interface 115 within the above-described low concentration range.

A preferable configuration is such that any one of, or two or more of metals selected from the group consisting of Hf, Zr, Al, La, Pr and Y, out of the metals listed in the above, reside at the interface 115. Presence of these metals at the interface 115 makes it possible to further exactly adjust the threshold voltage of the P-type MOSFET 103. A more preferable configuration is such that any one of, or two or more of metals selected from the group consisting of Hf, Zr and Al reside at the interface 115. This makes it possible to still further exactly adjust the threshold voltage of the P-type MOSFET 103.

In the P-type MOSFET 103 in which polycrystalline silicon film 106 has a P-type conductivity, it is preferable to use Hf or Zr out of the metals listed in the above. Each of Hf and Zr is an element known to cause the Fermi level pinning in polysilicon, and is also understood as causing a large increase in the threshold voltage in a transistor having the polycrystalline silicon film 106 with a P-type conductivity. Use of Hf or Zr can therefore raise the degree of freedom in controlling the threshold voltage of the P-type MOSFET 103.

For the case where a plurality of the above-described metals reside at the interface 115, the concentration at the interface 115 is adjusted for each of these metals so as to fall in a range from $5 \times 10^{13}$ atoms/cm$^3$ or more and less than $1.4 \times 10^{15}$ atoms/cm$^3$.

The configuration explained in the above was such as adjusting the Hf concentration at the interface 115 to a range from $5 \times 10^{13}$ atoms/cm$^2$ or more and less than $1.4 \times 10^{15}$ atoms/cm$^3$, whereas another allowable configuration is such as allowing Hf to reside in the SiON film 113, which is a gate insulating film directly in contact with the polycrystalline silicon film 106, with a concentration of $5 \times 10^{13}$ atoms/cm$^3$ or more and less than $1.4 \times 10^{15}$ atoms/cm$^3$. Also this configuration is successful in adjusting the Hf concentration at the interface 115 to $5 \times 10^{13}$ atoms/cm$^2$ or more and less than $1.4 \times 10^{15}$ atoms/cm$^2$, and in intentionally causing the Fermi level pinning at the interface.

The Hf concentration in the SiON film 113 adjusted within the above-described concentration range makes it possible to exactly adjust the threshold voltage of the P-type MOSFET 103, if the adjustment is combined with the ion dosage into the channel region 105. The configuration in which Hf is contained in the gate insulating film with a concentration from $5 \times 10^{13}$ atoms/cm$^3$ or more and less than $1.4 \times 10^{15}$ atoms/cm$^3$ will be described later in the fifth embodiment, referring to FIGS. 7D and 7E.

The P-type MOSFET 103 may be one of transistors composing a CMOS. This successfully raises the ON-state current of the transistors in the CMOS. This also makes it possible to reduce the GIDL current and variation in the threshold voltage.

Second Embodiment

A configuration according to the second embodiment is similar to that of the semiconductor device 100 in the first embodiment. The second embodiment employs the CVD process for the process step adhering Hf element to the interface 115 (FIG. 2C).

In the CVD process, the Hf source gas is supplied onto the SiON film 113, as being diluted with an inert gas such as N$_2$ gas or with other gas such as SiH$_4$. Use of a Si-containing gas as a dilution gas will be described later in the fifth embodiment. Supply of the Hf source after being diluted can lower partial pressure of the Hf source in the supplied gas. This makes it possible to lower the amount of adhesion of Hf onto the surface of the SiON film 113. More specifically, the concentration of Hf in the total gas volume to be supplied is typically adjusted to 1 atom percent to 50 atoms percent, both ends inclusive.

Thereafter, the processes similar to those explained above in the first embodiment referring to FIGS. 3A to 3C are carried out, to thereby obtain the semiconductor device 100 shown in FIG. 1. In this embodiment, the effect similar as that achieved in the first embodiment is also obtained.

Third Embodiment

The configurations of the semiconductor device 100 described in the above embodiments were such as having the P-type MOSFET 103 provided therein, whereas a configuration of the third embodiment is also applicable to a MOSFET in which the polycrystalline silicon film 106 has an N-type conductivity. Also for the N-type MOSFET, adoption of the configuration below will be able to increase the ON-state current. It is also possible to reduce the GIDL current and the substrate current upon application of the substrate voltage. Variation in the threshold voltage can also be suppressed.

Figure 4:
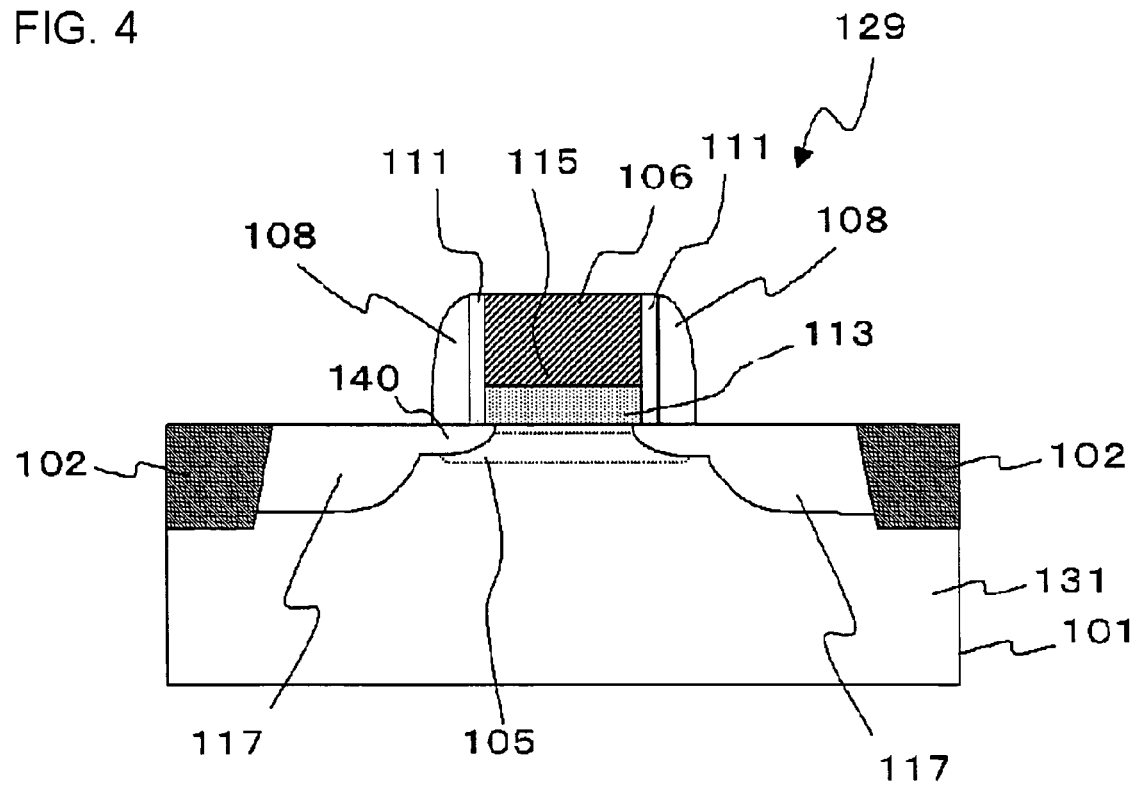
FIG. 4 is a sectional view showing a configuration of a semiconductor device according to another embodiment of the present invention.

FIG. 4 is a drawing schematically showing a configuration of a semiconductor device of the third embodiment. A semiconductor device 118 shown in FIG. 4 differs from the semiconductor device 100 shown in FIG. 1, in that an N-type MOSFET 129, in place of the P-type MOSFET 103 (FIG. 1), is provided on the silicon substrate 101.

In the N-type MOSFET 129, a P-well 131 is formed in place of the N-well 104 of the P-type MOSFET 103 shown in FIG. 1. Also an impurity diffused regions 117 having an N-type impurity diffused therein are provided in place of the impurity diffused regions 110. The polycrystalline silicon film 106 is configured as having an N-type impurity such as P, As or the like diffused therein.

Also in this embodiment, the semiconductor device 118 can be fabricated by the methods described in the first or second embodiment. For example, Al atoms can be allowed to reside at the interface 115 by the ALD process explained in the first embodiment, by using trimethyl aluminum, in place of HfCl$_4$, as a source gas in the sequence (ii) in the above. The sequences from (ii) to (iv) are repeated 10 times. Concentration of Al in Al$_2$O$_3$ at the interface 115 in this case can be adjusted to $8\times10^{14}$ atoms/cm$^2$ or around.

The metals allowed to reside at the interface 115 are exemplified by any one of, or two or more of those listed in the first embodiment. Among these metals, Al is preferably used for the N-type MOSFET 129. Al is known to cause the Fermi level pinning. Also, Al causes a large increase in the threshold voltage in a transistor having the polycrystalline silicon film 106 with an N-type conductivity. Therefore, use of Al can exactly raise the degree of freedom in controlling the threshold voltage of the N-type MOSFET 129 in which the polycrystalline silicon film 106 has an N-type conductivity.

In the semiconductor device 118, the metal which resides at the interface 115 may be Hf or Zr. The selection can reduce the electrical thickness of the SiON film 113. This makes it possible to increase the ON-state current of the N-type MOSFET 129.

Fourth Embodiment

Figure 5:
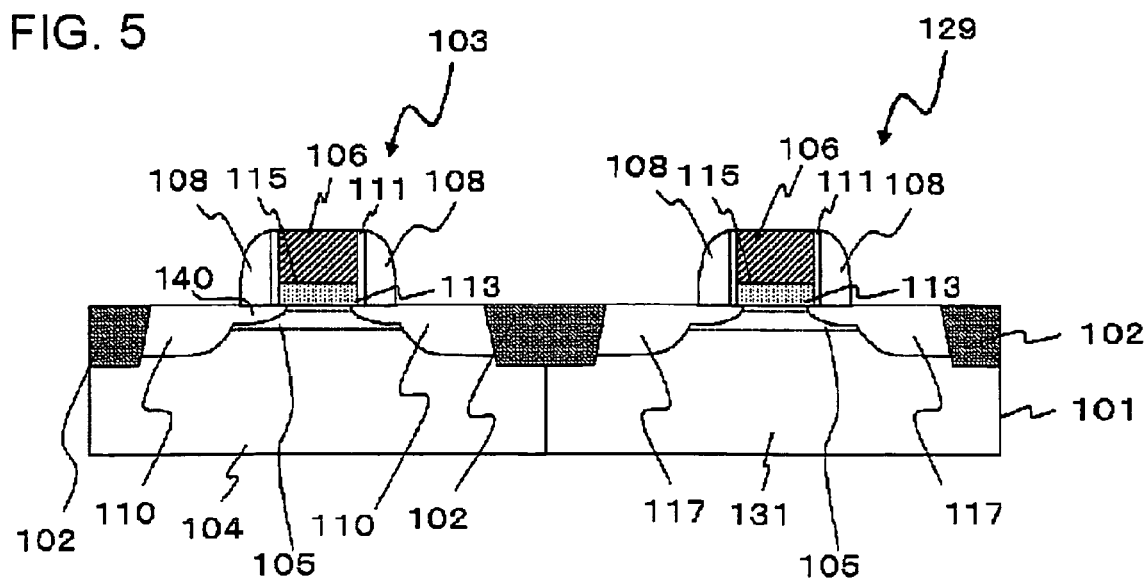
FIG. 5 is a sectional view showing a configuration of a semiconductor device according to still another embodiment of the present invention.

The fourth embodiment relates to a CMOS (complementary metal oxide semiconductor) device using the semiconductor devices described in the above embodiments. FIG. 5 is a sectional view showing a configuration of a semiconductor device of the fourth embodiment. The semiconductor device of the fourth embodiment has a CMOS device in which the P-type MOSFET 103 (FIG. 1) and the N-type MOSFET 129 (FIG. 4) are arranged in parallel while placing the element isolation region 102 in between. The CMOS device composes an internal circuit of an LSI.

The semiconductor device shown in FIG. 5 can be configured so that the metal of the same species and concentration commonly resides at the interface 115 in the P-type MOSFET 103 and at the interface 115 in the N-type MOSFET 129. This is successful in raising the threshold voltage of both of the P-type MOSFET 103 and the N-type MOSFET 129. This makes it possible to control the threshold voltage of both transistors by adjusting the concentration of the metal allowed to reside at the interface 115 and the concentration of impurity in the channel region 105, and to obtain an effect of increasing the ON-state current.

One possible configuration herein is that the same concentration of a predetermined metal element resides at the interface 115 in the P-type MOSFET 103 and at the interface 115 in the N-type MOSFET 129. This successfully simplifies the fabrication process. An exemplary configuration herein is such that Hf having a concentration of $2\times10^{14}$ atoms/cm$^2$ resides at both interfaces 115 of these transistors. The threshold voltage of the P-type MOSFET 103 rises by 0.2 V, and the threshold voltage of the N-type MOSFET 129 rises by 0.15 V.

It is therefore made possible to raise the threshold voltage of the N-type MOSFET 129 and the P-type MOSFET 103, by adjusting the abundance of the metal at the interface 115. Adjustment of the degree of increase in the threshold voltage also enables an arbitrary adjustment without relying upon impurity implantation into the substrate. It is also made possible to reduce the amount of channel impurity as compared with the case where the threshold voltage is controlled only by the amount of channel impurity, if the threshold voltage required for the semiconductor device is controlled using the amounts of trace metal which resides at the interface 115 together with the amount of channel impurity. This consequently makes it possible to increase the ON-state current of CMOS, reduce the GIDL current, and suppress the substrate current upon application of the substrate voltage.

Another possible configuration is such that a plurality of same species of the metals reside at the interfaces 115. This makes it possible to further exactly adjust the threshold voltage of each of the P-type MOSFET 103 and the N-type MOSFET 129. For example, a possible configuration is such that $1\times10^{14}$ atoms/cm$^2$ of Hf resides at both interfaces 115, and also $1\times10^{14}$ atoms/cm$^2$ of Al resides at both interfaces 115.

The semiconductor device shown in FIG. 5 may also be configured so that the different species of the metals reside at the interface 115 in the P-type MOSFET 103 and at the interface 115 in the N-type MOSFET 129, respectively. More specifically, a possible configuration is such that Hf resides at the interface 115 in the P-type MOSFET 103, and Al resides at the interface 115 in the N-type MOSFET 129. This makes it possible to further increase the degree of freedom in adjustment of the threshold voltage of these transistors. Another configuration having Zr, in place of Hf, contained at the interface 115 in the P-type MOSFET 103 is also acceptable.

In this embodiment, the adjustment of the threshold voltage in CMOSFET is explained as an example, however, the configuration having a plurality of MOSFETs of same conductivity type is also available. In this case, the similar effect is achieved by selecting the species of the metal and the concentration thereof residing on the interface 115 are set to be as described in the first to the third embodiments and as common, configuring so that at least one of the MOSFETs has an impurity concentration in the channel region thereof differed from impurity concentration in the channel regions of the other MOSFET.

Fifth Embodiment

The semiconductor devices described above in the foregoing embodiments were such as having the SiON film 113 and the polycrystalline silicon film 106 stacked therein, and that a predetermined concentration of a predetermined metal resides at the interface therebetween. The gate herein may also be configured as follows.

FIGS. 6A to 6C and FIGS. 7A to 7E are sectional views schematically showing other structures applicable as the gate of the semiconductor devices described in the foregoing embodiments.

Figure 6A:
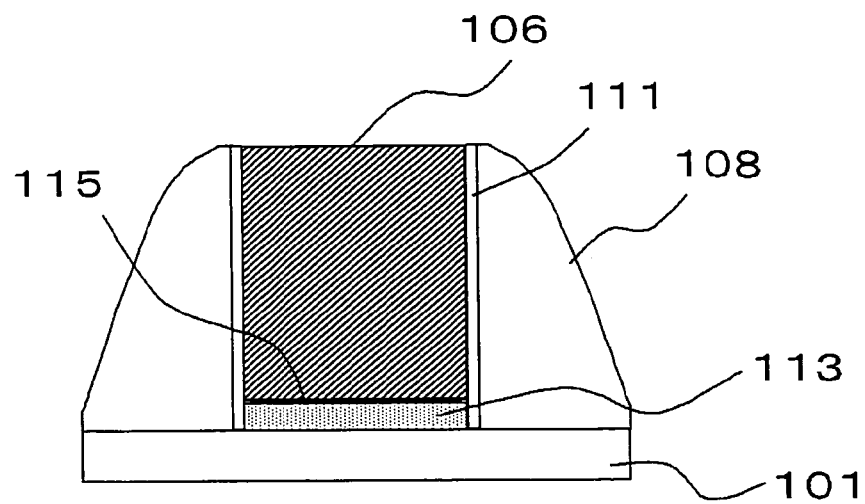
FIGS. 6A to 6C are sectional views showing configurations of gates of the semiconductor devices according to embodiments of the present invention.
Figure 6B:
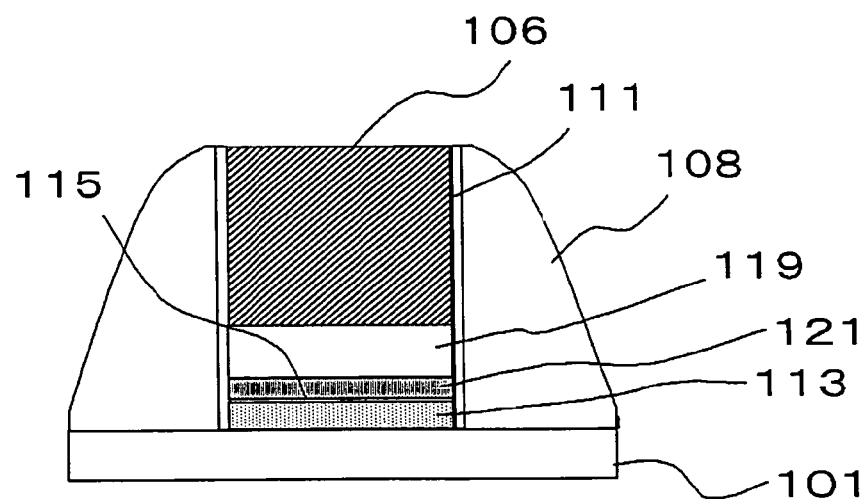

FIG. 6A corresponds to a configuration of the gate of the transistors described in the foregoing embodiments. FIG. 6B shows a configuration in which a Si-containing gate electrode, which comprises an α-Si film 121 as a seed layer, a polycrystalline SiGe film 119 and a polycrystalline silicon film 106 layered in this order, is formed on the SiON film 113, and a trace amount of Hf or the like resides at the interface 115 between the SiON film 113 and the α-Si film 121. Use of the polycrystalline SiGe film 119 makes it possible to reduce the inversion film thickness of the gate electrode film. This configuration, having a trace amount of Hf element located between the gate electrode film containing Si and the gate insulating film, or the interface 115, also makes it possible to intentionally cause the Fermi level pinning to thereby adjust the threshold voltage of the transistor, similarly to as described in the above embodiment.

Figure 6C:
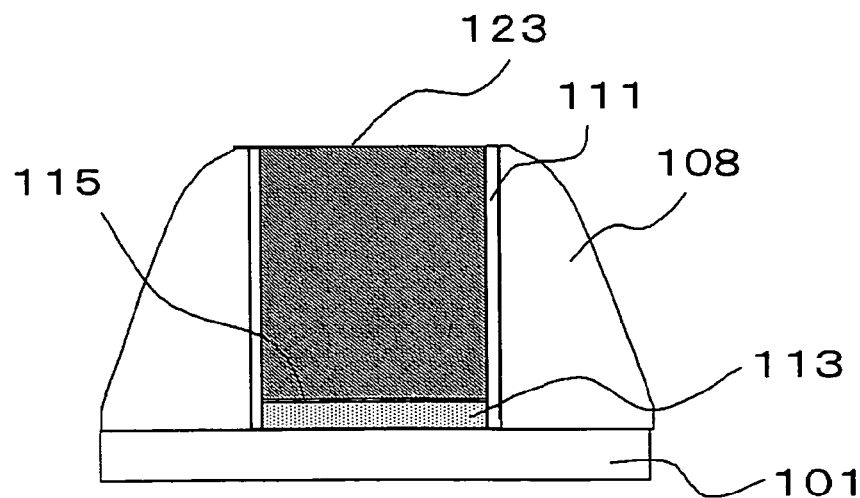

The configuration shown in FIG. 6C is similar to that shown in FIG. 6A except that a NiSi film 123 is provided in place of the polycrystalline silicon film 106. Also this configuration makes it possible to adjust the threshold voltage, similarly to as described in the above embodiments. Use of the NiSi film 123 is successful in reducing the inversion film thickness observed in the conventional metal gate electrode. The NiSi film 123 in the configuration shown in FIG. 6C can be formed typically as described below. First, after the process step shown in FIG. 3C, a metal film is formed over the entire surface by depositing Ni typically by the sputtering process. Annealing is then carried out so as to allow Ni to react with the polycrystalline silicon film 106 (silicidation) to thereby convert the gate electrode into the NiSi film 123. A non-reacted portion of the Ni film remaining on the insulating film and so forth is then etched off using a chemical solution.

The configurations of the gate electrode film were shown in the above, whereas other configurations are allowable also for the gate insulating film. FIG. 7A to FIG. 7E show variations in the configuration of the gate insulating film.

Figure 7A:
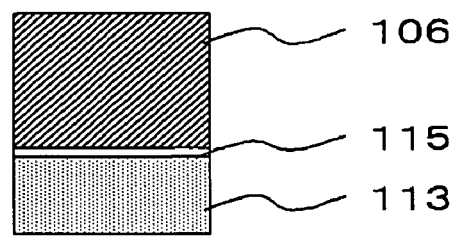
FIGS. 7A to 7E are sectional views showing other configurations of gates of the semiconductor devices according to embodiments of the present invention.
Figure 7B:
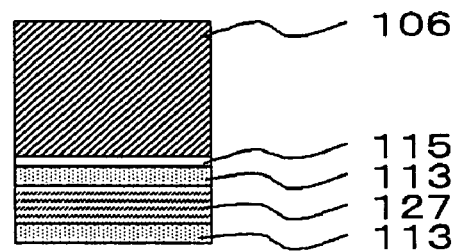

FIG. 7A corresponds to a configuration of the gate insulating film of the transistors described in the above embodiments. FIG. 7B shows a configuration in which the SiON film 113, a high dielectric constant film 127, the SiON film 113 and a polycrystalline silicon film 106 are layered in this order on the channel region 105 (not shown). A stacked film comprising the SiON film 113, the high dielectric constant film 127 and the SiON film 113 configures the gate insulating film. A trace amount of the metal such as Hf is allowed to reside at the interface 115 between the SiON film 113 and the polycrystalline silicon film 106.

Figure 7C:
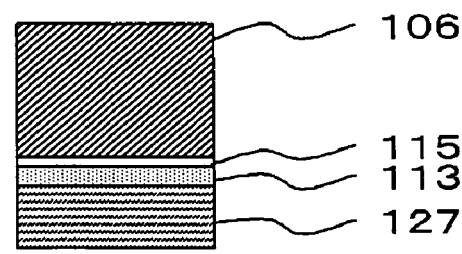

FIG. 7C shows a configuration in which the high dielectric constant film 127, the SiON film 113 and the polycrystalline silicon film 106 are stacked in this order on the channel region 105 (not shown). A trace amount of the metal such as Hf is allowed to reside at the interface 115 between the SiON film 113 and the polycrystalline silicon film 106.

In the configurations shown in FIG. 7B and FIG. 7C, the high dielectric constant film 127 is a film having a dielectric constant higher than that of silicon oxide, and can be composed of so-called, high-k film. The high dielectric constant film 127 can be configured using a material having a dielectric constant of 6 or larger. More specifically, the high dielectric constant film 127 can be configured using a material containing either one of, or both of Hf and Zr, and can be configured as an oxide film, a silicate film or the like containing either of these metal elements.

The high dielectric constant film 127 can be formed by the CVD process, ALD (atomic layer deposition) process or the like. In this embodiment, hafnium silicate is adopted as a material for the high dielectric constant film 127. Film formation of this material is carried out by using an organic hafnium source gas, an oxidative gas, and a silicon-containing gas. Concentration of an element diffused into the high dielectric constant film 127 to be obtained can be adjusted to a desired value, by appropriately controlling flow rates of the individual components of the film forming gas. HTB (Hf(OtBu)$_4$) and monosilane (SiH$_4$) can typically be used as the components of the film forming gas.

In the configurations shown in FIG. 7B and FIG. 7C, the high dielectric constant film 127 is provided in the gate insulating film so as to avoid direct contact with the polycrystalline silicon film 106. This configuration is successful in raising the dielectric constant of the gate insulating film and in imparting a good heat resistance, while ensuring an exact adjustment of abundance of the metals at the interface 115. This contributes to expansion of the degree of freedom in the threshold voltage, downsizing of the MOSFET, and improvement in the reliability.

As shown in FIG. 7B, provision of the SiON film 113 also between the high dielectric constant film 127 and the channel region 105 (not shown) makes it possible to desirably suppress diffusion of the metal element contained in the high dielectric constant film 127. Reliability of the transistor can therefore be improved.

Figure 7D:
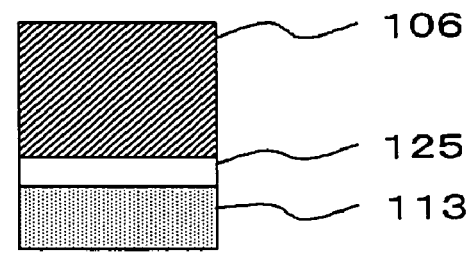
Figure 7E:
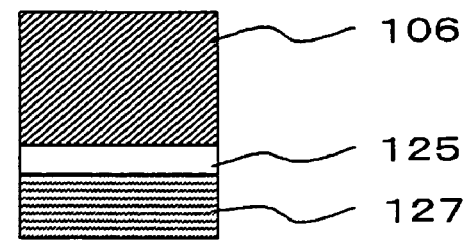

The configurations shown in FIG. 7D and FIG. 7E are such as, having, as the gate insulating film, a threshold voltage adjusting film 125 in contact with the polycrystalline silicon film 106. The threshold voltage adjusting film 125 herein contains Hf with a concentration of $5 \times 10^{13}$ atoms/cm$^3$ or more and less than $1.4 \times 10^{15}$ atoms/cm$^3$. The threshold voltage adjusting film 125 may be any insulating film containing an element capable of raising the threshold voltage when the film is provided in contact with the polycrystalline silicon film. It is therefore also allowable to adopt a configuration in which one of, or two or more of the metals listed in the first embodiment are contained in place of Hf.

In the configuration shown in FIG. 7D, the gate insulating film is composed of a stacked film of the SiON film 113 and the threshold voltage adjusting film 125, wherein the polycrystalline silicon film 106 is provided in contact with the threshold voltage adjusting film 125. In the configuration shown in FIG. 7E, the gate insulating film is composed of a stacked film of the high dielectric constant film 127 and the threshold voltage adjusting film 125, wherein the polycrystalline silicon film 106 is provided in contact with the threshold voltage adjusting film 125. The threshold voltage adjusting film 125 is typically a hafnium silicate film having a Hf concentration of $5\times10^{13}$ atoms/cm$^3$ or more and less than $1.4\times10^{15}$ atoms/cm$^3$. The configurations shown in FIG. 7D and FIG. 7E can be fabricated as follows. First, the SiON film 113 or the high dielectric constant film 127 is formed by the methods described in the above referring to FIG. 2A and FIG. 2B, and the threshold voltage adjusting film 125 is provided on the SiON film 113 or on the high dielectric constant film 127. The process steps described in the above referring to FIG. 3A to FIG. 3C are then carried out.

The threshold voltage adjusting film 125 can typically be formed by the CVD process. In the CVD process, the Hf concentration in the threshold voltage adjusting film 125 must be adjusted to a trace level. Therefore, the threshold voltage adjusting film 125 cannot be formed under conditions for forming the high dielectric constant film 127, and instead other conditions will be necessary. An organic hafnium source gas and a silicon-containing gas are used as the source gases, wherein the organic hafnium source gas is diluted with the silicon-containig gas. The Hf concentration in the obtained threshold voltage adjusting film 125 can consequently be diluted with Si to a satisfactory degree.

More specifically, when monosilane (SiH$_4$) is used as the silicon-containing gas, the concentration of Hf in the total gas volume to be supplied is typically adjusted to 1 atom percent to 50 atoms percent, both ends inclusive. Examples of the gas adoptable herein include oxygen as the oxidative gas, and monosilane (SiH$_4$) as the silicon-containing gas. Thickness of the threshold voltage adjusting film 125 is typically set to a range from 0.3 nm to 3 nm, both ends inclusive.

In the configurations shown in FIG. 7D and FIG. 7E, a trace amount of Hf is contained in a layer, in contact with the polycrystalline silicon film 106, composing the gate insulating film. This consequently makes it possible to adjust the threshold voltage of the transistor through control of the Hf concentration, similarly to as described in the above embodiments. It is also allowable to use disilane (Si$_2$H$_6$) as the silicon-containing gas used as a source for the threshold voltage adjusting film 125.

In this embodiment, the high dielectric constant film 127 may also be composed of an oxide film of Hf, Zr or the like, a silicate film, or an oxynitride film.

In this embodiment, the configuration having a plurality of MOSFETs of same conductivity type is also available. The species of the metal and the concentration thereof may be selected as commonly residing in the gate insulating film and set to be as described above, and at least one of the MOSFETs may have an impurity concentration in the channel region therof differed from impurity concentration in the channel regions of the other MOSFET.

Further, this embodiment may be applied to a CMOSFET, and the species of the metal and the concentration of a NMOSFET and a PMOSFET may be selected as commonly residing in the gate insulating films and set to be as described above, and the NMOSFET may have an impurity concentration in the channel region therof differed from impurity concentration in the channel regions of the PMOSFET.

The embodiments of the present invention have been described referring to the attached drawings, wherein the embodiments are of an exemplary purpose, allowing adoption of any other various configurations.

For example, the concentration of the metal element residing at the interface 115 in the above embodiments can be measured by EELS (electron energy loss spectrometry) or SIMS (secondary ion mass spectrometry).

In the above embodiments, it is also allowable to use, as the gate insulating film, a SiO$_2$ film in place of the SiON film 113.

EXAMPLES

Example 1

In Example 1, investigations were made on changes in the threshold voltage of the P-type MOSFET 103 (FIG. 1) described in the first embodiment and the N-type MOSFET 129 (FIG. 4) described in the third embodiment, having Hf as the metal to be contained at the interface 115, observed when the concentration thereof was varied. Adhesion of Hf onto the surface of the SiON film 113 was carried out by the above-described ALD process. The Hf concentration was varied by varying the amount of adhesion of Hf by varying the number of cycles of repetition of the chemical adhesion sequence.

Figure 8:
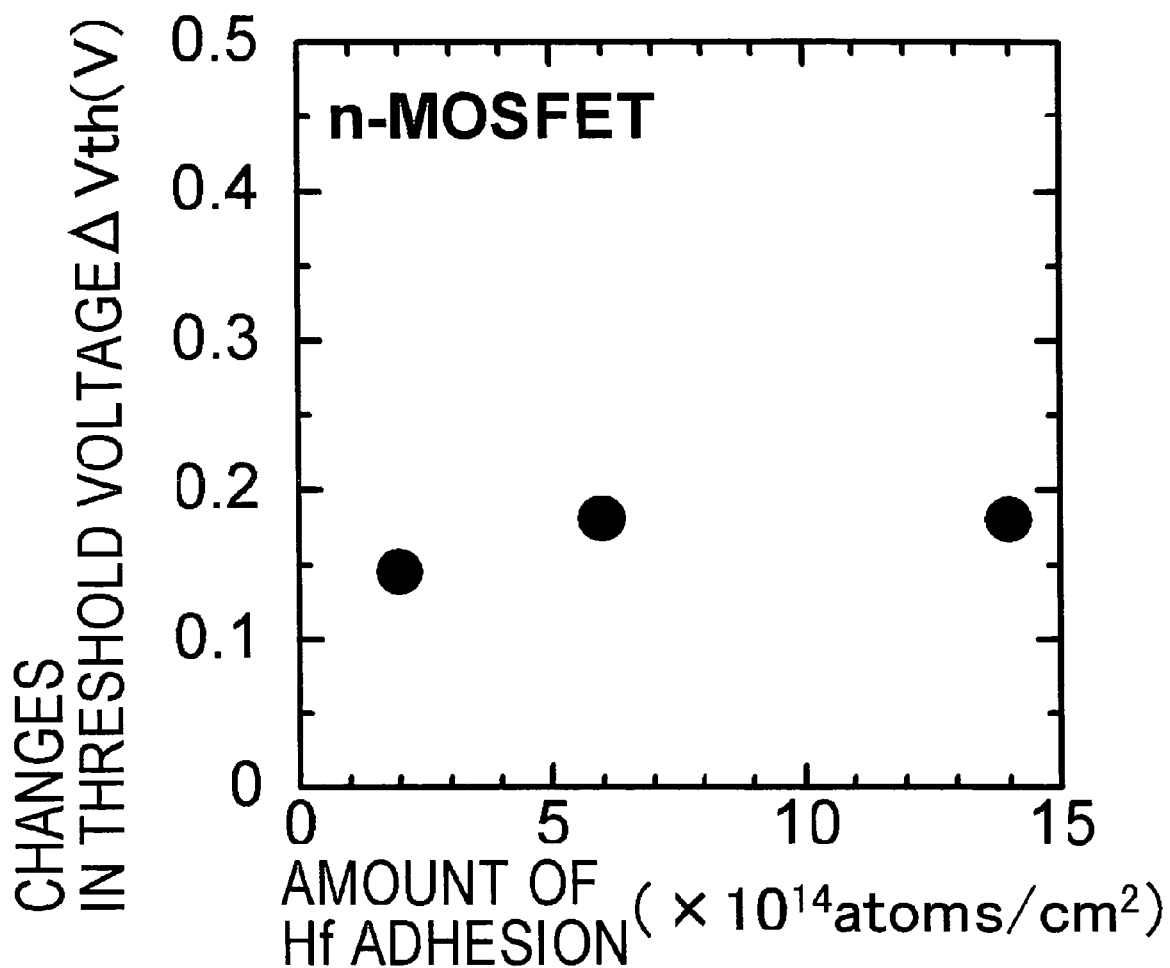
FIG. 8 is a drawing showing a relation between Hf concentration and changes in the threshold voltage of an N-type MOSFET of an embodiment.
Figure 9:
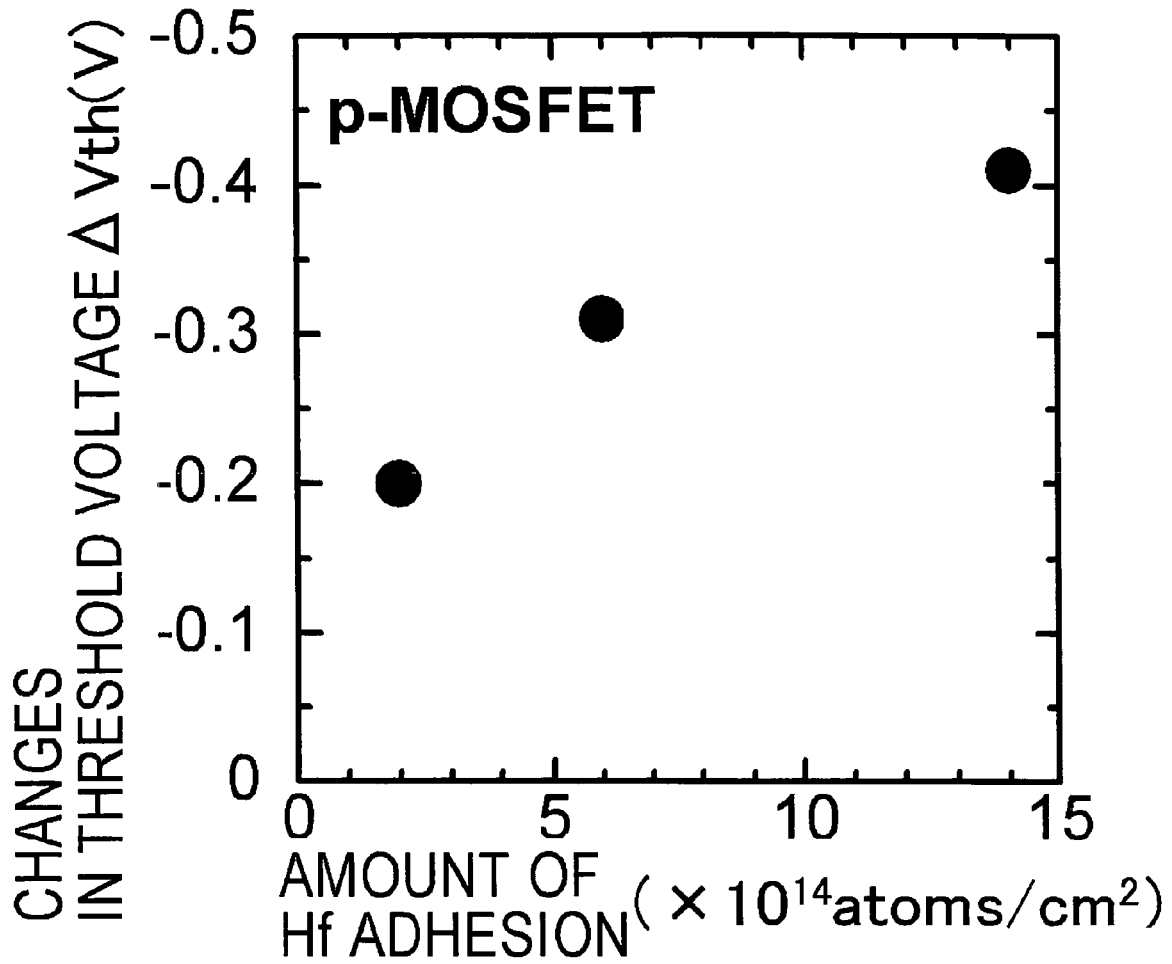
FIG. 9 is a drawing showing a relation between Hf concentration and changes in the threshold voltage of a P-type MOSFET of an embodiment.

FIG. 8 is a drawing showing a relation between Hf concentration at the interface 115 and changes in the threshold voltage of the N-type MOSFET 129 (FIG. 4). FIG. 9 is a drawing showing a relation between Hf concentration at the interface 115 and changes in the threshold voltage of a P-type MOSFET 103 (FIG. 1). From FIG. 8 and FIG. 9, it was confirmed that the threshold voltage of the MOS transistors could successfully be adjusted by varying the Hf concentration at the interface 115.

In the experiments shown in FIG. 8 and FIG. 9, employed was an apparatus capable of achieving a Hf concentration of $2\times10^{14}$ atoms/cm$^2$ at the interface 115 per single chemical adhesion sequence.

Example 2

Example 2 relates to the CMOS device shown in FIG. 5. In Example 2, the threshold voltage of the P-type MOSFET 103 is set to −0.35 V, and the threshold voltage of the N-type MOSFET 129 is set to 0.35 V.

In the fabrication of the P-type MOSFET 103 and the N-type MOSFET 129, $1\times10^{15}$ atoms/cm$^2$ of Hf is adhered by the ALD process on the SiON film 113. Values of the threshold voltage of the P-type MOSFET 103 and the N-type MOSFET 129 are now adjusted, without doping of channel impurity, to −0.35 V and 0.18 V, respectively.

To achieve the target value for the threshold voltage, $5\times10^{12}$ atoms/cm$^2$ of B is implanted into the channel region 105 of the N-type MOSFET 129. This is successful in obtaining the CMOS device in which the P-type MOSFET 103 and the N-type MOSFET 129 have the target values for the threshold voltage (−0.35 V and 0.35 V, respectively).

In Example 2, desired threshold voltage values can be obtained without implanting any channel impurity for the P-type MOSFET 103. Also for the N-type MOSFET 129, the dose of the impurity can be reduced. These transistors are therefore excellent in the ON-state current characteristics. These transistors can also successfully suppress increase in the GIDL current, and can suppress the substrate current upon application of the substrate voltage. These transistors also makes it possible to accurately adjust the threshold voltage, and to suppress variations therein.

Example 3

In this example, the semiconductor device described in the end of the fourth embodiment and having a plurality of MOS- FETs of same conductivity type provided on the same substrate will be explained. FIGS. 10A to 10D are sectional views schematically showing process steps of fabricating the semiconductor device according to this example. That is, this example is a case wherein two kinds of N-type MOSFETs differed in the threshold voltage are fabricated on a single substrate by varying the impurity dose in the channel regions, while keeping the transistor structure including gate insulating film, gate electrode and so forth unchanged. Here, a target threshold voltage of an N-type MOSFET (A) was specifically set to 0.35 V, and a target threshold voltage of an N-type MOSFET (B) was specifically set to 0.45 V. This way of fabrication, such that the MOSFETs differed in the threshold voltage are formed on a single substrate, and a MOSFET having a relatively high threshold voltage is applied to a circuit not critical in terms of operation speed, is successful and effective in reducing the stand-by power consumption ascribable to the sub-threshold leakage, as compared with the case where the entire circuit is configured using low-threshold-voltage MOSFETs only.

Figure 10:
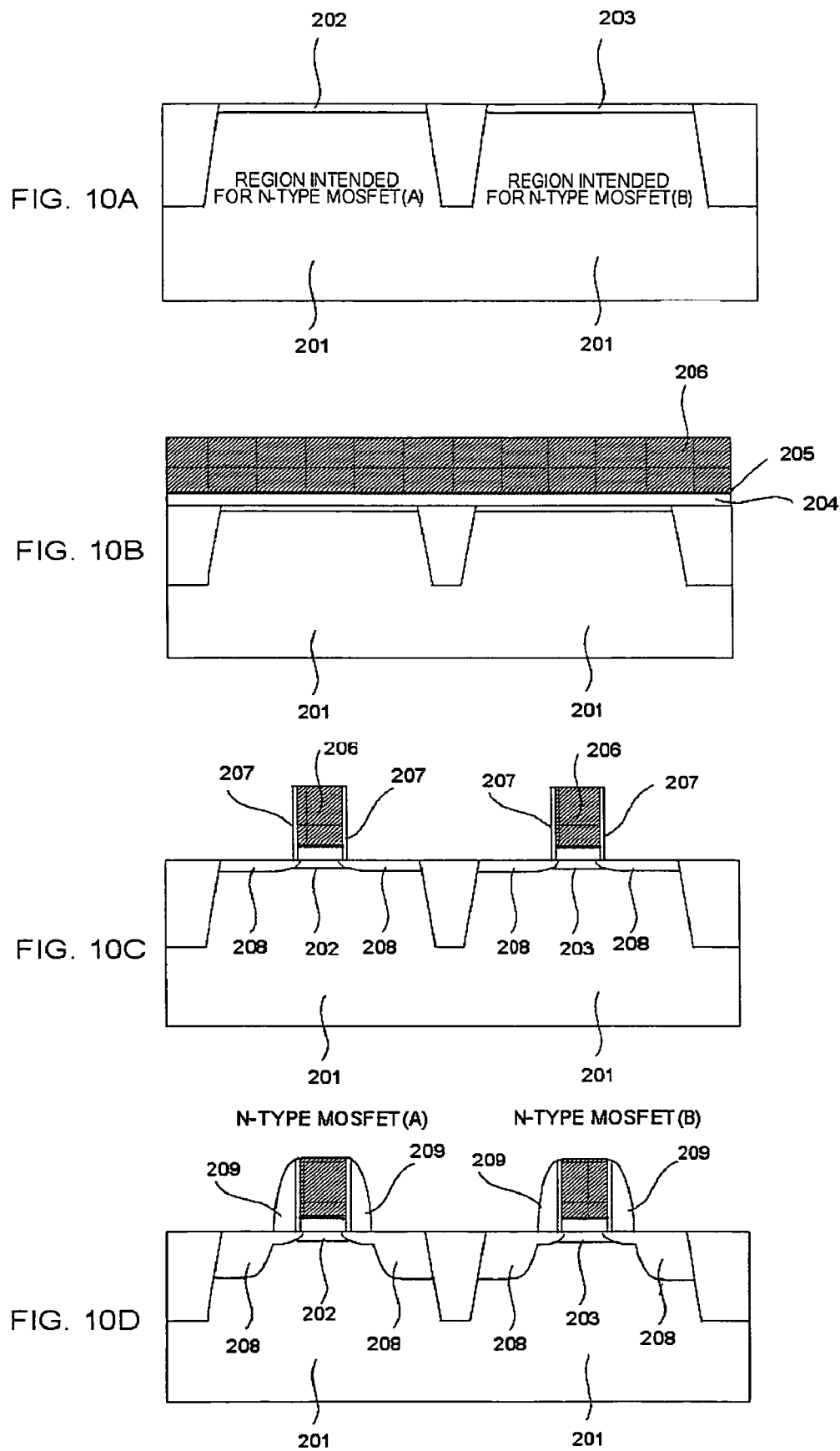
FIGS. 10A to 10D are sectional views showing process steps of fabricating the semiconductor device of an example.

First, as shown in FIG. 10A, element formation regions are defined, and a P-well 201, a channel region 202 of the N-type MOSFET (A), a channel region 203 of the N-type MOSFET (B) are formed by implanting B ions. As described later, in this Example, $2\times10^{14}$ atoms/cm$^2$ of Hf is allowed to deposit on a SiON film 204 by the ALD process. In this case, the channel region 202 is implanted with $6\times10^{12}$ atoms/cm$^2$ of B, and the channel region 203 is implanted with $9\times10^{12}$ atoms/cm$^2$ of B, to thereby adjust the threshold voltage values of the individual N-type MOSFETs to the target values described in the above.

Figure 11:
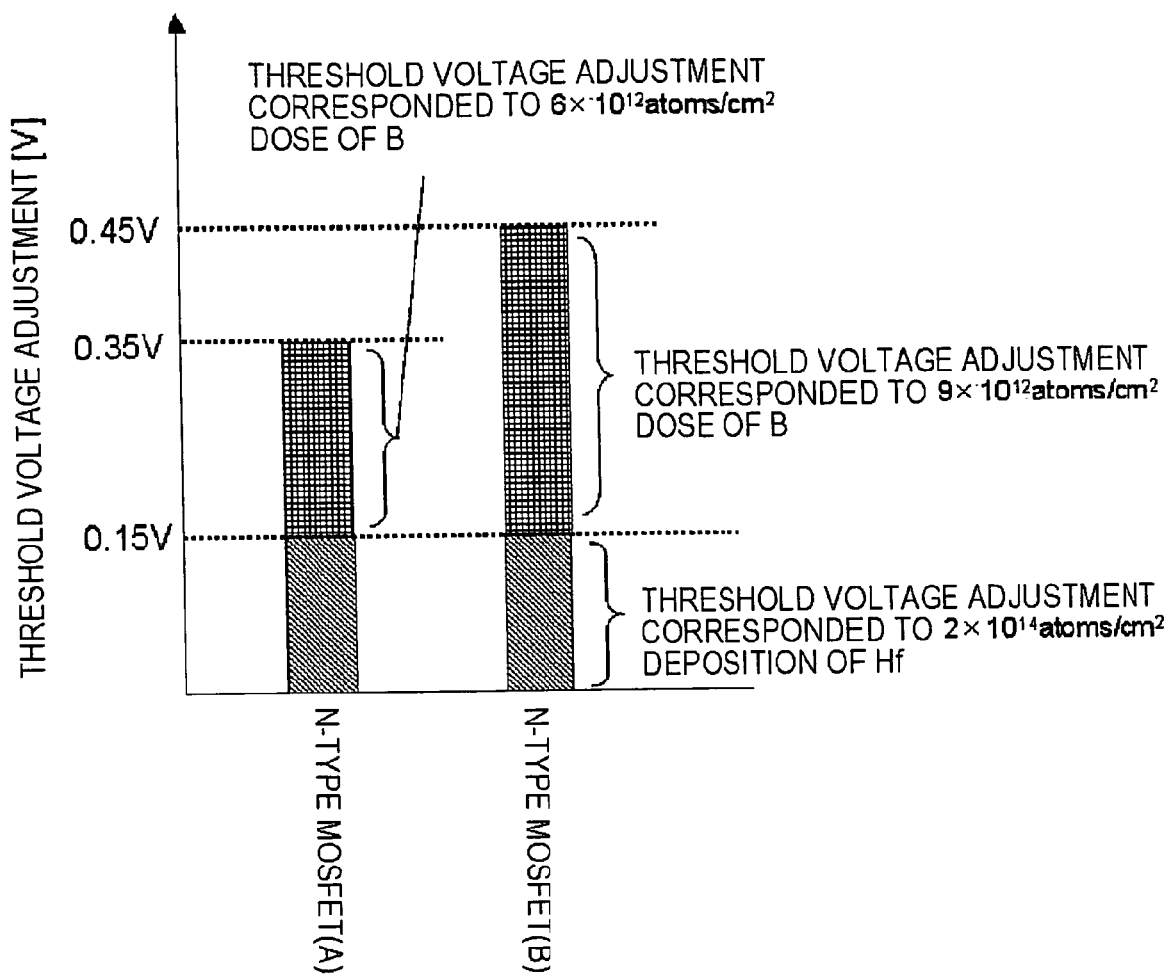
FIG. 11 is a conceptual drawing explaining impurity dose in the channel region in relation to the amount of Hf deposition in the example.

A concept for designing threshold voltages in this example is shown in FIG. 11. Deposition of $2\times10^{14}$ atoms/cm$^2$ of Hf in terms of surface density on the SiON film 204 causes a 0.15-V increase in the threshold voltage. Therefore, the N-type MOSFET (A) having $6\times10^{12}$ atoms/cm$^2$ of B implanted in the channel region 202 thereof will have a threshold voltage of 0.35 V. Similarly, the N-type MOSFET (B) having $9\times10^{12}$ atoms/cm$^2$ of B implanted in the channel region 203 thereof will have a threshold voltage of 0.45 V.

That is, Hf is made adhere to the SiON films 204 of the N-type MOSFETs (A) and (B) of same conductivity type so as to be the same surface density. Thus, the shift amounts of the threshold voltages of the N-type MOSFETs (A) and (B) caused by Hf are set to be same. On that basis, dose amount of impurity doped into each channel region of the N-type MOSFETs (A) and (B) is varied so as to form two MOSFETs of different threshold voltages. Also, when three or more MOSFETs each having different threshold voltage are fabricated, the threshold voltage is adjusted by setting the surface density of Hf adhering to the SiON film 204 of each MOSFET to be same, and varying the amount of impurity doped into each of channel regions. To do so, for a plurality of MOSFETs of the same conductivity type and different threshold voltages, the threshold voltage is adjusted by two-stage approach including an adjustment of the steady value by adhesion of the metal on the gate insulating film and an individual adjustment by doping the impurity into the channel region.

Here, the case of Hf was explained as an example, the metal may be changed to others described in the third embodiment. Also, the N-type MOSFET was explained as an example, a threshold voltage of P-type MOSFET can similarly be adjusted.

The threshold voltage of the individual N-type MOSFETs can thus be adjusted to the target values as described in the above. It is understood that deposition of Hf was successful in reducing the dose of B by $4.5\times10^{12}$ atoms/cm$^2$, in both N-type MOSFETs. This consequently resulted in reduction in the effect of impurity-induced scattering in the inversion layer, increase in the mobility, and in increase the ON-state current. This also successfully moderated the vertical electric field in the vicinity of the drain edge, and consequently resulted in reduction in the GIDL current and the substrate current upon application of the substrate voltage.

Subsequent to the B ion implantation into the channel region as shown in FIG. 10A, the SiON film 204 is formed as shown in FIG. 10B, and $2\times10^{14}$ atoms/cm$^2$ of Hf is allowed to deposit by the ALD process as described in the above, to thereby form a Hf deposition layer 205. A polycrystalline silicon film 206 is then formed.

Next, as shown in FIG. 10C, the polycrystalline silicon film 206 is patterned, and the Hf deposition layer 205 and the SiON film 204 are sequentially patterned, to thereby form sidewall barrier films 207 of 2 nm thick, composed of silicon nitride. In order to further form extension regions, arsenic is ion-implanted under conditions of 10 KeV, $2\times10^{14}$ atoms/cm$^2$, to thereby form an N-type diffusion layer 208.

Next, sidewall insulating films 209 are formed. Thereafter, arsenic is ion-implanted under conditions of 30 KeV, $5\times10^{15}$ atoms/cm$^2$, to thereby deepen the junction depth of the N-type diffusion layer 208 in the source/drain region.

The above-described process steps yield two kinds of N-type MOSFETs differed from each other in the threshold voltage, formed on a single substrate. Deposition of Hf on SiON successfully reduced impurity concentration in the channel regions of the individual N-type MOSFETs, increased the ON-state current as compared with the case where the threshold voltage was set only depending on the impurity dose in the channel regions, and reduced the substrate current upon application of the substrate voltage.

It is apparent that the present invention is not limited to the above embodiments, that may be modified and changed without departing from the scope and spirit of the invention.

What is claimed is:

1. A semiconductor device having a plurality of field effect transistors each of which comprising:
   a semiconductor substrate;
   a Si-containing gate electrode provided on said semiconductor substrate; and
   a gate insulating film provided between said semiconductor substrate and said Si-containing gate electrode, so as to contact with said Si-containing gate electrode,
   wherein each of said plurality of field effect transistors has at least one metal selected from the group consisting of Hf, Zr, Al, La, Pr, Y, Ti, Ta and W contained at the interface between said Si-containing gate electrode and said gate insulating film,
   wherein said interface separates said Si-containing gate electrode from said gate insulating film with no more than a single atomic layer of said metal,
   wherein said at least one metal bonds with silicon in said Si-containing gate electrode at a surface of said Si-containing gate electrode,
   wherein a work function of said metal changes nonlinearly, with changing concentration of said metal, from an end of a conduction band of Si or an end of a valence band of Si to an energy level that is different from a work function of a mass of said metal, and
   wherein at least one of said field effect transistors has an impurity concentration in the channel region of said one of said field effect transistor differed from impurity concentration in the channel regions of the other field effect transistor.

2. The semiconductor device according to claim 1, wherein said plurality of field effect transistors comprises a plurality of first field effect transistors of a same conductivity type,
said interfaces in said plurality of first field effect transistors contain said metal of the same species and concentration in common, and
an impurity concentration in the channel region of at least one of said plurality of first field effect transistors is different from an impurity concentration in the channel region of another one of said plurality of first field effect transistors.

3. The semiconductor device according to claim 1, wherein said plurality of field effect transistors comprises an N-channel field effect transistor and a P-channel field effect transistor, and
said interface in said N-channel field effect transistor and said interface in said P-channel field effect transistor contain said metal of the same species in common.

4. The semiconductor device according to claim 3, wherein said Vth of said P channel field effect transistor and N channel field effect transistor both increase nonlinearly with increasing the concentration of said metal.

5. The semiconductor device according to claim 1, wherein said plurality of field effect transistors comprises an N-channel field effect transistor containing Al as said metal.

6. The semiconductor device according to claim 1, wherein said plurality of field effect transistors comprises a P-channel field effect transistor containing Hf or Zr as said metal.

7. The semiconductor device according to claim 1, wherein said Si-containing gate electrode contains Ni or Ge.

8. The semiconductor device according to claim 1, wherein said gate insulating film comprises a SiON film.

9. The semiconductor device according to claim 1, wherein said field effect transistor is P channel field effect transistor and Vth of said P channel field effect transistor increases nonlinearly with increasing the concentration of said metal.

10. The semiconductor device according to claim 1, wherein said field effect transistor is N channel field effect transistor and Vth of said P channel field effect transistor increases nonlinearly with increasing the concentration of said metal.

11. A semiconductor device having a field effect transistor which comprises:
a semiconductor substrate;
a Si-containing gate electrode provided on said semiconductor substrate; and
a gate insulating film provided between said semiconductor substrate and said Si-containing gate electrode, so as to contact with said Si-containing gate electrode;
wherein said field effect transistor has at least one metal selected from the group consisting of Hf, Zr, Al, La, Pr, Y, Ti, Ta and W contained at the interface between said Si-containing gate electrode and said gate insulating film,
wherein said interface separates said Si-containing gate electrode from said gate insulating film with no more than a single atomic layer of said metal,
wherein said at least one metal bonds with silicon in said Si-containing gate electrode at a surface of said Si-containing gate electrode, and
wherein a work function of said metal changes nonlinearly, with changing concentration of said metal, from an end of a conduction band of Si or an end of a valence band of Si to an energy level that is different from a work function of a mass of said metal.

12. The semiconductor device according to claim 11, further comprising a plurality of the field effect transistor, the plurality of field effect transistors all having a same conductivity type,
wherein said interfaces in said plurality of field effect transistors contain said metal of the same species and concentration in common, and
wherein an impurity concentration in the channel region of at least one of said plurality of field effect transistors is different from an impurity concentration in the channel region of another one of said plurality of field effect transistors.

13. The semiconductor device according to claim 11, including a plurality of said field effect transistors, wherein
said plurality of field effect transistors comprises an N-channel field effect transistor and a P-channel field effect transistor, and
said interface in said N-channel field effect transistor and said interface in said P-channel field effect transistor contain said metal of the same species in common.

14. The semiconductor device according to claim 13, wherein said Vth of said P channel field effect transistor and N channel field effect transistor both increase nonlinearly with increasing the concentration of said metal.

15. The semiconductor device according to claim 11, wherein said Si-containing gate electrode contains Ni or Ge.

16. The semiconductor device according to claim 11, wherein said gate insulating film comprises a SiON film.

17. The semiconductor device according to claim 11, wherein said field effect transistor is P channel field effect transistor and Vth of said P channel field effect transistor increases nonlinearly with increasing the concentration of said metal.

18. The semiconductor device according to claim 11, wherein said field effect transistor is N channel field effect transistor and Vth of said P channel field effect transistor increases nonlinearly with increasing the concentration of said metal.

* * * * *